United States Patent [19]

Agusta et al.

[11] 3,731,375

[45] May 8, 1973

[54] MONOLITHIC INTEGRATED STRUCTURE INCLUDING FABRICATION AND PACKAGING THEREFOR

[75] Inventors: Benjamin Agusta; Paul H. Bardell; Paul P. Castrucci, all of Poughkeepsie; Robert A. Henle, Hyde Park; Raymond P. Pecorato, Poughkeepsie, all of N.Y.

[73] Assignee: International Business Machines Corporation, Armonk, N.Y.

[22] Filed: Apr. 16, 1970

[21] Appl. No.: 33,127

Related U.S. Application Data

[62] Division of Ser. No. 539,210, March 31, 1966, Pat. No. 3,508,209.

[52] U.S. Cl. ........................29/577, 29/578, 29/589

[51] Int. Cl. ........................B01j 17/00, H01l 1/16

[58] Field of Search ..................29/589, 577, 577 IC, 29/578

[56] References Cited

UNITED STATES PATENTS

| | | | |
|---|---|---|---|
| 3,295,031 | 12/1966 | Schmitz | 317/235 |
| 3,333,326 | 8/1967 | Thomas et al. | 29/577 UX |
| 3,392,442 | 7/1968 | Napier et al. | 29/589 X |

*Primary Examiner*—John F. Campbell
*Assistant Examiner*—W. Tupman
*Attorney*—Hanifin and Jancin and George O. Saile

[57] ABSTRACT

A method of making a monolithic integrated semiconductor structure that has a plurality of functionally isolated individual cells that are electrically interconnected. Each of the cells is an object of mirror image cell that is vertically, horizontally and diagonally displaced from the object cell. The plurality of cells provide a memory array with electrical components of each memory cell composed of active and passive semiconductor devices. Other importance aspects of the structure include underpass connections and active devices in a common portion of the structure which are electrically interconnected at the same node potential by means of a highly doped buried region within the common portion of the structure.

1 Claim, 40 Drawing Figures

INVENTORS
BENJAMIN AGUSTA
PAUL H. BARDELL
PAUL P. CASTRUCCI
ROBERT A. HENLE
RAYMOND P. PECORARO

BY [signature]
ATTORNEY

FIG. 1G
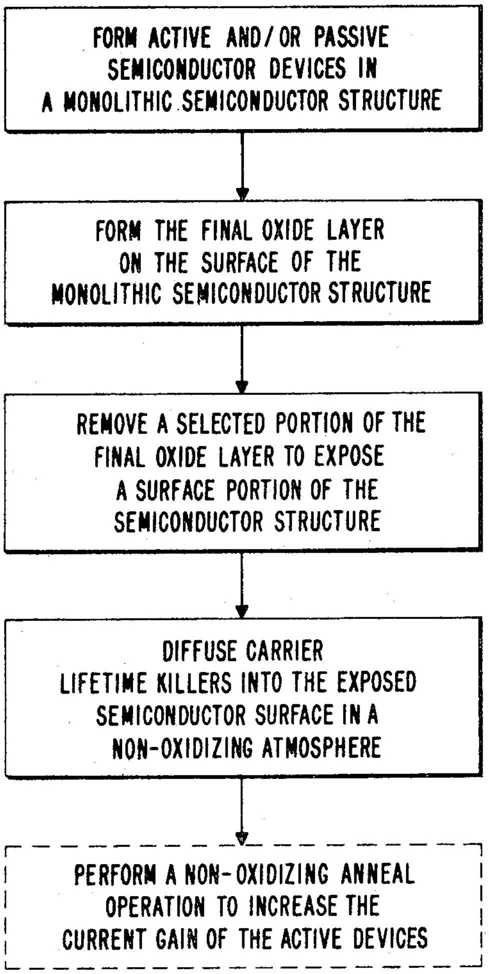
FIG. 3G
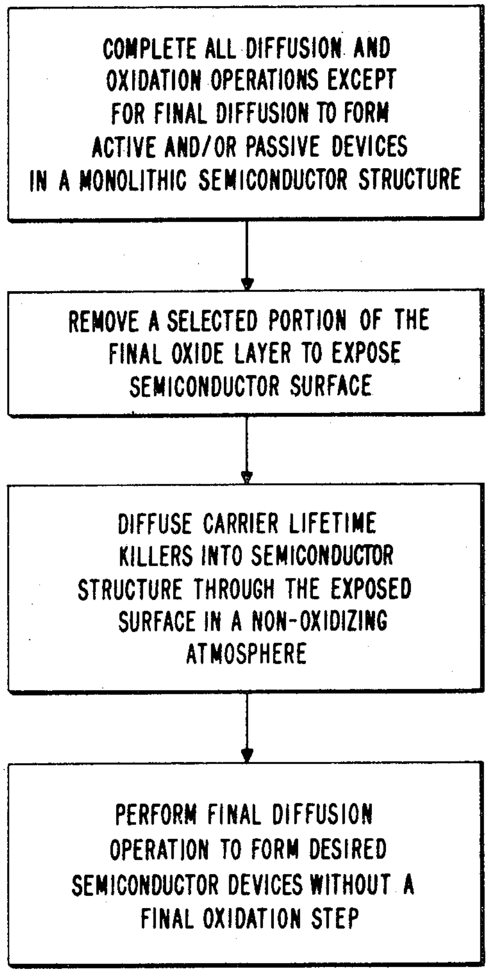
TOTAL CARRIER LIFETIME KILLER DIFFUSION TIME (INCLUDING FURNACE RECOVERY TIME)
| TEMP \ TIME | 5 (MIN) | 20 (MIN) | 30 (MIN) | 60 (MIN) |
|---|---|---|---|---|
| 970°C | — | 50 $\beta$ 16-17 $\tau$ | 40-50 $\beta$ 10-11 $\tau$ | 15-17 $\beta$ 8.5-9 $\tau$ |
| 1000°C | — | 30-40 $\beta$ 7.5-8 $\tau$ | — | — |
| 1025°C | 25-35 $\beta$ 6-6.5 $\tau$ | 15-25 $\beta$ 4.0 $\tau$ | — | — |
FIG. 2G

| OBJECT (WORD) | VERTICAL PLANE MIRROR IMAGE (WORD) | HORIZONTAL PLANE MIRROR IMAGE (WORD) | DIAGONAL IMAGE (WORD) |
|---|---|---|---|
| 1 | 5 | 2 | 6 |
| 3 | 7 | 4 | 8 |
| 9 | 13 | 10 | 14 |
| 11 | 15 | 12 | 16 |

MASK A-
FOR SUBCOLLECTOR DIFFUSIONS
AND BARRIER FOR CONNECTORS

MASK B-
FOR ISOLATION AND CONNECTION DIFFUSIONS

MASK C-FOR BASE, DIODE AND RESISTOR DIFFUSIONS AND CONNECTOR CONTACTS

MASK D-FOR EMITTER DIFFUSIONS AND COLLECTOR CONTACTS

MONOLITHIC INTEGRATED STRUCTURE INCLUDING FABRICATION AND PACKAGING THEREFOR

This is a Divisional Application of co-pending U. S. Patent Application Serial No. 539,210 filed on March 31, 1966, now Patent No. 3,508,209, and assigned to the assignee of this application.

This invention relates generally to monolithic integrated structures including the fabrication and package therefor and, more particularly, to a monolithic integrated memory cell that is expandable into a memory array of $q2^n \times m2^n$ number of integrated memory cells where $q$ and $m$ are integers and $n$ is either zero or is an integer greater than zero.

Ferrite cores over the years have established an enviable reputation for having electrical characteristics that are not a function of time. However, the metallic wires that thread the cores are subject to corrosion and must be protected, depending upon the atmosphere in which the array will operate. In some instances, vibration of cores in the array can cause physical damage resulting in a malfunction.

A monolithic memory array containing 64,000 words of 72 bits involves a significant number of components and interconnections. A 5-million bit monolithic memory array utilizing the unit cell of this invention would have 25 million transistors and 20 million other components in the storage array proper. The addition of the drivers and sense and decode circuitry is likely to add another 20 percent to this component count. Hence, fabrication and reliability considerations must be considered in determining the BOM (Basic Operating Memory) sizes.

The key to the formation of a monolithic memory array is the monolithic memory cell.

Ideally, a monolithic memory cell that is to be expanded into a memory array should have the following qualities and features:

1. The cell should be capable of being expanded into any reasonable size planar array with minimum degradation of performance.
2. It should consist of devices that occupy a small planar area so as to obtain maximum arrays per processed wafer.
3. The cell circuit should consume very little power so as to permit high package circuit densities and minimize power supplies and power line requirements.
4. The cell should have a fast read capability when expanded into an array.
5. The cell should have a fast write time capability when expanded into an array.
6. The cell should have low internal impedances in order to obtain fast switching capability.
7. The cell should have a fast recovery time after reading or writing operations so as to permit fast repetition rates.
8. The cell should have non-destructive read capability, thus permitting faster memory operation since reading cycles do not have to be followed by a write cycle.
9. The memory state of the cell in an array should be AC and DC isolated from the sense line and thereby not be sensitive to spurious signals and other noise generated by read or write operations and noise pulses on the sense line.

10. The memory cell in an array should be randomly accessible as opposed to serial information storage sources so as to permit fast machine cycle time.
11. The cell should consist of component devices that permit topological interconnection relief (underpass) such that the final array can be simply fabricated and interconnected. This avoids the need of a costly second conductive level or interconnection layer and reduces the amount of underpass connectors needed.
12. The cell and array should preferably not have reactive components such as capacitors and/or inductors since these are relatively difficult to fabricate in a monolithic structure.
13. The cell and array should have device and fabrication specifications that are easily achievable with monolithic batch fabrication techniques.
14. The cell and array should be operable over a wide temperature range without performance degradation.
15. The cell should have a complementary output, thus permitting differential sensing, if needed, in large arrays or for logic purposes.
16. The cell should require a minimum number of low value supply voltages and be consistent with logic circuitry voltages.
17. In order to obtain universality of usage, the cell and array should be capable of operating over a wide range of voltages without performance degradation. This feature also permits longer life and greater reliability since it is less sensitive to device degradation with time. Also, it can withstand high voltage transients without deleterious effects.
18. The cell should preferably not contain complementary devices (NPN and PNP), therefore making the monolithic structure easier to fabricate.
19. The required array, drive, sense and decode circuitry, which will eventually be incorporated in the monolithic integrated chip, must have device requirements compatible with the cell, preferably without the need for additional process steps.
20. The device specifications of the array, drive, sense, and decode circuitry should be such that they take advantage of technology improvements, such as closer photomasking and diffusion tolerances which give planar space reduction and/or faster devices that simultaneously improve memory performance and cost.
21. The cell can easily be modified to associative memory applications.
22. The cell can be easily modified for either two or three dimensional operation. A three dimensional operation takes advantage of the last stage of address decoding. A square three dimensional matrix of cells with complementary sense lines results in minimum external contact connections.
23. The cell and array should have a minimum number of input-output signal leads.
24. The cell should have no quiescent sense power.
25. The cell should have one or more signal modes of a high input impedance which permit the series addition of underpass connectors.
26. The cell and array should have a very high "1" signal to "0" signal ratio and, in addition, should have a minimum spurious noise signal.

27. The read power is independent of information latching power in the cell.

28. The output signal is a constant energy output during the read operation. This eliminates the need for reactive sensing and strobing. This permits easy sense amplifier design and makes the output signal insensitive to interrogate rise times.

29. The output signal should be a current (or voltage) source with typical 1 to 5 milliampere current capability.

30. Each cell and the entire array should be capable of being tested independent of the "1" or "0" conducting states of other cells. This permits a short testing cycle time of the entire array.

31. As the temperature of the monolithic structure increases, the cell should take advantage of the increased transistor current gain ($\beta$).

32. The array interrogate signals should require voltages and speeds identical or consistent with logic levels.

33. The cell interconnected into an array should have a minimum number of monolithic process steps.

34. The cell and array should facilitate layout of the signal lines and permit the use of low impedance sense loads to minimize noise coupling.

35. The components of the cell and the array should be compatible with PN, dielectric, and other monolithic isolation processes or techniques.

Accordingly, it is an object of this invention to provide an improved monolithic integrated structure.

It is a further object of this invention to provide an improved monolithic memory structure.

It is a still further object of this invention to provide an improved fabrication method for making monolithic integrated structures.

It is a still further object of this invention to provide an improved fabrication method for making monolithic integrated memory structures.

It is a further object of this invention to provide an improved memory cell adaptable for interconnection into a memory array.

It is a further object of this invention to provide a memory cell and/or memory array capable of meeting all of the above mentioned desirable characteristics that are important for a memory cell.

It is a still further object of this invention to provide an improved package for a monolithic integrated structure.

In accordance with one embodiment of this invention, the monolithic integrated semiconductor structure comprises a plurality of functionally isolated individual cells that are electrically interconnected. Each of the cells is an object or a mirror image cell that is vertically, horizontally and diagonally displaced from the object cell. The plurality of cells provide a memory array with the electrical components of each memory cell composed of active and passive semiconductor devices.

The foregoing and other objects, features and advantages of the invention will be apparent from the following more particular description of a preferred embodiment of the invention as illustrated in the accompanying drawings.

In the drawings:

FIG. 1G is a flow diagram of the fabrication steps of a monolithic integrated structure in accordance with one gold doping embodiment of this invention;

FIG. 2G is a table showing the transistor current gain $\beta$ and the carrier lifetime $\tau$ (in nanoseconds) dependent on the time and temperature of the carrier lifetime killer diffusion cycle and the anneal operation in the embodiment of FIG. 1G;

FIG. 3G is a flow diagram of another gold doping embodiment;

FABRICATION METHOD (FIG. 1)

Figure 1:
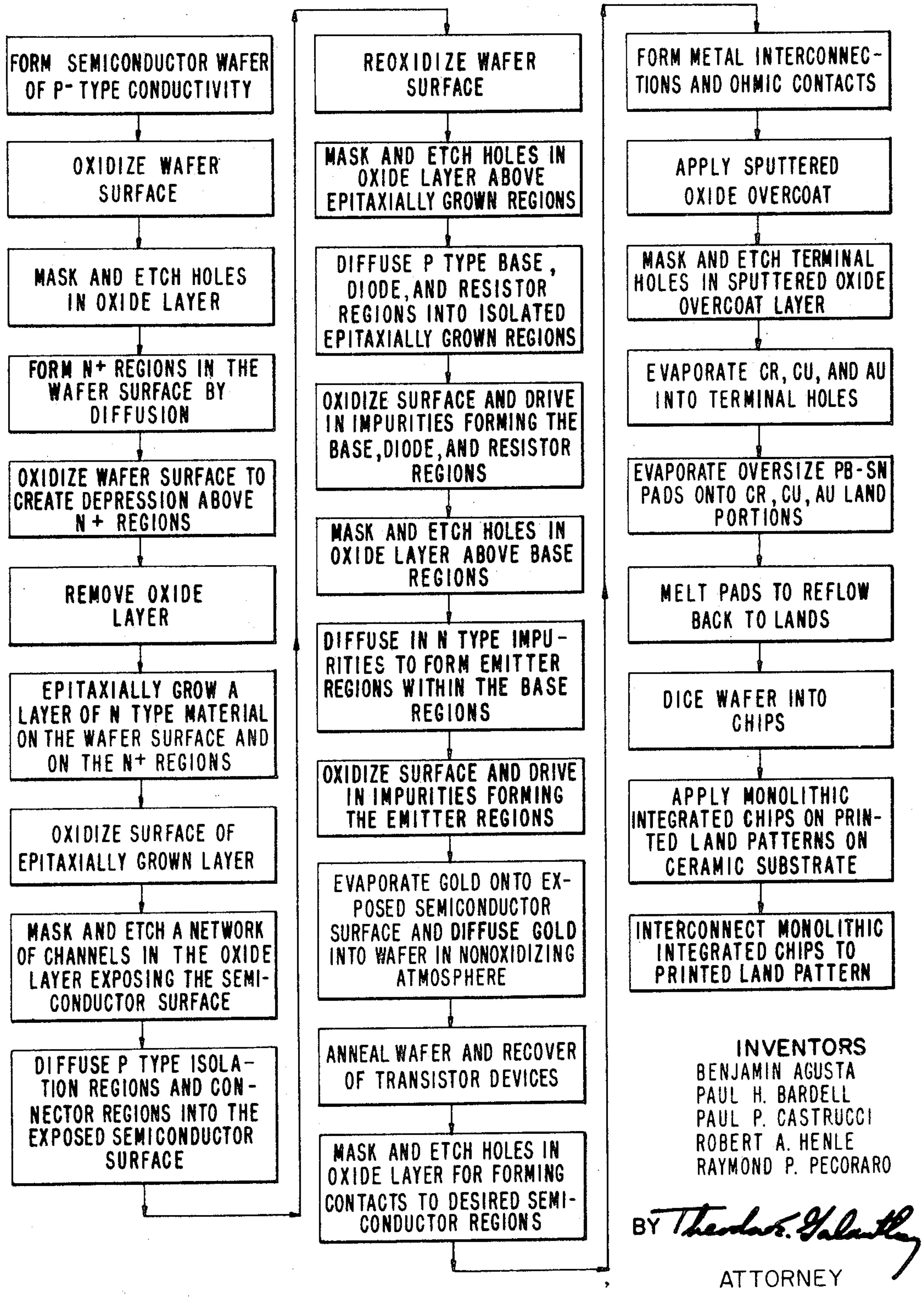
FIG. 1 is a flow diagram of the entire fabrication process for making the monolithic integrated structure and interconnecting it to a conductive land pattern formed on a ceramic substrate.

In discussing the semiconductor fabrication method, the usual terminology that is well known in the transistor field will be used. In discussing concentrations, references will be made to majority or minority carriers. By "carriers" is signified the free-holes or electrons which are responsible for the passage of current through a semiconductor material. Majority carriers are used in reference to those carriers in the material under discussion, i.e. holes in P type material or electrons in N type material. By use of the terminology "minority carriers" it is intended to signify those carriers in the minority, i.e. holes in N type material or electrons in P type material. In the most common type of semiconductor materials used in present day transistor structure, carrier concentration is generally due to the concentration of the "significant impurity," that is, impurities which impart conductivity characteristics to extrinsic semiconductor materials.

Although for the purpose of describing this invention reference is made to a semiconductor configuration wherein a $P^-$ type region is utilized as the substrate and subsequent semiconductor regions of the composite semiconductor structure are formed in the conductivity type described, it is readily apparent that the same regions that are referred to as being of one conductivity type can be of the opposite type conductivity and furthermore, some of the operations which are described as diffusion operations can be made by epitaxial growth and some of the epitaxial growth regions can also be fabricated by diffusion techniques.

A wafer of $P^-$ type conductivity, preferably having a resistivity of 10 to 20 ohms-centimeter is used as the starting material. The wafer is preferably a monocrystalline silicon structure which can be fabricated by conventional techniques such as by pulling a silicon semiconductor member from a melt containing the desired impurity concentration and then slicing the pulled member into a plurality of wafers. The wafers are cut, lapped and chemically polished to 7.9 (±0.8) mils in thickness. The wafers are oriented 4° (±0.5°) off the 111 axis towards the 110 direction.

An initial oxide layer or coating preferably of silicon dioxide and having a thickness of 5,200 Angstrom units is thermally grown by conventional heating in a dry $O_2$ atmosphere for 10 minutes followed by heating in a wet or steam atmosphere at 1,050° C for 60 minutes. If desired, the oxide layer can be formed by pyrolytic deposition or by an RF sputtering technique, as described in a U.S. Pat. application identified as Ser. No. 428,733, filed Jan. 28, 1965 in the names of Davidse and Maissel and assigned to the same assignee as this invention.

By standard photolithographic masking and etching techniques a photoresist layer is deposited onto the wafer including the surface of the initial oxide layer formed thereon and by using the photoresist layer as a mask surface regions are exposed on the surface of the wafer by etching away the desired portions of the $SiO_2$ layer with a buffered HF solution. The photoresist layer is then removed to permit further processing.

A diffusion operation is carried out to diffuse into the exposed surface portions of the wafer N type impurities to form $N^+$ regions in the wafer having a $C_o$ of $2 \times 10^{20} cm^{-B3}$ of N type majority carriers. The initial oxide layer serves as a mask to prevent an $N^+$ region from being formed across the entire surface of the wafer. Preferably, the diffusion operation is carried out in an evacuated quartz capsule using degenerate arsenic doped silicon powder. As an alternative variation, the $N^+$ regions can be formed by etching out a channel in the $P^-$ type wafer and then subsequently epitaxially growing $N^+$ regions.

An oxidation cycle of 10 minutes in dry $O_2$ and 30 minutes in steam at 1,150° C is carried out. The resulting oxide thickness is 6,000 Angstrom units on the $N^+$ regions and only 3,000 Angstrom units thick on the remainder of the wafer surface. Hence, removal of the oxide layer with a buffered HF solution leaves a depression in the $N^+$ semiconductor surface regions.

After removing the oxide layer, a region of N type conductivity, preferably having a resistivity of about 0.2 ohms per centimeter, is epitaxially grown on the surface of the wafer. The N type epitaxial region is an arsenic doped layer approximately 5.5 to 6.5 microns thick. In actual device fabrication, the arsenic impurities in the $N^+$ regions, which are now buried, outdiffuse about one micron during the epitaxial deposition.

Another oxide layer approximately 5,200 Angstrom units thick is formed on the surface of the epitaxially grown region either by the same thermal oxidation process, by pyrolytic deposition, or by RF sputtering techniques.

A number of openings are formed in specific areas of the oxide layer by standard photolithographic masking and etching techniques using a photoresist layer as a mask and a buffered HF solution for etching away the oxide portions. The structure is now prepared for a second diffusion operation which is for isolation of the active and passive devices to be formed and, if desired, to form underpass connectors later described and also written up in the patent application entitled "Low Resistivity Semiconductor Underpass Connector and Fabrication Method Therefor" assigned to the same assignee of this invention and filed concurrently herewith.

A P type diffusion step is carried out, preferably using a boron source, to form $P^+$ regions in the N type epitaxially grown layer. This diffusion operation is carried out at a temperature of 1,200° C for a period of 95 minutes forming a $C_o$ (surface concentration) of $5 \times 10^{20}cm^{-3}$. It is evident that the $P^+$ diffused regions will each have a low resistivity surface region which extends downwardly from the surface of the semiconductor structure. In forming isolation diffusions, the diffused $P^+$ type regions reach and become continuous with the original substrate or $P^-$ starting material.

Another oxide layer is formed after the isolation or connector diffusion operation. This oxide layer is preferably 4,300 Angstrom units thick and can be formed by a thermal oxidation process such as by heating at 1,050° C for a period of 5 minutes in dry $O_2$ followed by 15 minutes in steam and 5 minutes in dry $O_2$.

A photoresist coating is applied to the surface of this oxide layer and by photolithographic masking and etching techniques desired portions of the $SiO_2$ layer are removed using a buffered HF solution.

A base and/or resistor diffusion is now carried out preferably using boron as the impurity source. This diffusion operation is for 70 minutes at 1,075° C and forms P type regions having an impurity surface concentration of $5 \times 10^{19}cm^{-3}$.

Diodes are also formed by the base and resistor diffusion step by carrying out this P type diffusion in a portion of the same N type epitaxially grown isolated region near the base region of the transistor. The base and resistor diffusion step is followed by a simultaneous reoxidation and drive-in operation. Another layer of $SiO_2$ is thereby grown having a thickness of about 3,600 Angstrom units on the base, diode, and resistor regions. During this heat treatment, the boron impurities are redistributed thereby increasing the junction depth and lowering the $C_o$. The oxidation drive-in cycle is 25 minutes in dry $O_2$ and 10 minutes in steam followed by 15 minutes in dry $O_2$ at 1,150° C.

In forming the transistor devices, a photoresist coating is applied over the oxide layer and by photolithographic masking and etching operations portions of this oxide layer are removed over the diffused base regions to permit emitter regions to be formed by a diffusion operation.

The N type emitter regions are formed in the P type base regions using preferably a phosphorous impurity source such as $POCl_3$ and heating the wafer in an atmosphere containing 700 parts per million of $POCl_3$ at a temperature of 970° C and for a period of 35 minutes. Preferably, the emitter and base regions are formed over the buried $N^+$ region to permit this region to act as a buried low resistivity sub-collector.

If desired, the low resistivity sub-collector region can be brought up to the surface of the transistor device and electrical contact made thereto in a dielectrically isolated transistor structure in accordance with the teachings contained in a patent application identified as Ser. No. 454,257, filed May 10, 1965, entitled "-Semiconductor Device Arrangement and Fabrication Method Therefor," in the names of Doo and Regh and assigned to the same assignee as this invention.

Now, a final oxidation and emitter drive-in operation is formed using a 5 minute dry $O_2$, 55 minute steam cycle followed by dry $O_2$ heat treatment (for a period of time depending on the depth of the collector) at 970° C. During this heat treatment operation, the final oxide layer is formed on the semiconductor surface. It is at this critical period in the process, after the final oxide layer is formed, that the carrier lifetime killer injection step is performed. An alternative method for injecting the carrier lifetime killers into the semiconductor structure is described below in the section entitled "Carrier Lifetime Killer Injection" and is also described in the patent application entitled "Improved Carrier Lifetime Killer Doping Process For Semiconductor Structures and the Product Formed Thereby" assigned to the same assignee of this invention and filed concurrently herewith.

The carrier lifetime killers are injected into the wafer through an opening in the oxide preferably in the backside of the wafer. Preferably, a layer of 200 Angstrom units of gold is evaporated on the wafer and the gold is diffused into the monolithic semiconductor structure by a heating operation of preferably 20 minutes at 1,000° C in a non-oxidizing atmosphere such as nitrogen. This gold diffusion operation is followed by an anneal cycle of 2 hours at 560° C in a non-oxidizing atmosphere such as nitrogen which also serves to increase the transistor current gain or $\beta$.

By using photolithographic masking and etching techniques, holes are opened up in the oxide layer in selected areas to fabricate the desired circuit. A layer of aluminum is evaporated over the entire wafer surface and portions of this layer are etched away to produce the desired interconnection pattern. The evaporated layer of aluminum has a thickness of 6,000 Angstrom units which was formed by depositing aluminum at a rate of 45 Angstrom units a second in a vacuum of $5 \times 10^{-6}$ torr. 1,500 Angstrom units are deposited at a wafer temperature of 200° C and the remaining 4,500 Angstrom units at a wafer temperature less than 100° C. A layer of photoresist is then applied to the wafer, dried, exposed, developed, and fixed. The aluminum interconnections are formed by a subtractive etching operation using a warm solution of $H_3PO_4 + HNO_3 + H_2O$. The photoresist layer is stripped off and the wafer is cleaned and dried.

The wavers are sintered in a nitrogen atmosphere at 450° C for 15 minutes to permit the aluminum to produce good ohmic contacts to the contacted semiconductor regions of the wafer.

A 1.5 micron thick film of quartz ($SiO_2$) is RF sputtered onto the front side of the wafers in accordance with the teachings contained in the patent application identified as Ser. No. 428,733, filed Jan. 28, 1965 in the names of Davidse and Maissel and assigned to the same assignee as this invention. A 12 inch diameter quartz disk is used as the cathode in the sputtering system. The wafers are loaded onto quartz disks which are reset in a copper anode which is approximately 1 inch away from the cathode. The system is evacuated and back filled with argon to a pressure of 20 microns. 1½ microns of quartz are deposited on the wafers in approximately 50 minutes at an input power level of 3 kw. The maximum wafer temperature during deposition is about 350° C. This insulating film encapsulates or seals the underlying semiconductor devices and aluminum interconnections, and protects them from chemical corrosion and other deliterious surface contaminants.

The thermal coefficient of expansion of sputtered $SiO_2$ is less than silicon and the resulting compressive mismatch produces extremely strong quartz films.

A photoresist layer is applied onto the sputtered quartz surface of the wafer, where it is dried, exposed, developed and fixed. The portions of the $SiO_2$ layer where the terminal hole areas are to be formed are etched away using buffered HF. The photoresist layer is removed and the wafer cleaned and dried. The wafer is then baked at 450° C for 30 minutes in a nitrogen atmosphere.

Each wafer is mounted into evaporation holders and metal land masks are aligned with the terminal holes. The holders are loaded into an evaporator which is evacuated to a pressure of $5 \times 10^{-6}$ torr. The chamber is then back filled to approximately $30 \times 10^{-3}$ torr and the holders are d.c. sputter cleaned for 15 minutes in accordance with the teachings described in a patent application entitled "Ion Bombardment Cleaning," Ser. No. 502,986, filed Oct. 23, 1965 and assigned to the same assignee of this invention. The chamber is then re-evacuated to a pressure of $5 \times 10^{-6}$ torr and 1,500 Angstrom units of Cr are evaporated followed by 5,000 Angstrom units of Cu and 1,500 Angstrom units of Au through the metal mask.

The wafers are now assembled in another evaporation holder and a mask which has larger size holes than the previous mask is aligned with the evaporated Cr-Cu-Au limiting lands. The evaporator is evacuated to a pressure of $5 \times 10^{-6}$ torr and 1.6 mils of 95-5 percent Pb-Sn are evaporated through the mask.

Each wafer is placed on a nitrogen purged hot plate or stage and heated to 340° C. The oversize Pb-Sn pads melt and since the solder does not wet the sputtered quartz surface there is a reflow back to the limiting lands. The reflow process yields Pb-Sn pads which are approximately 3 mils high and 4 mils in diameter.

The wafer is now ready to be diced into chips with each chip containing the monolithic integrated structure. One way of dicing the wafers is described in U.S. Pat. No. 3,241,265.

Preferably, each monolithic integrated chip is mounted on printed land portions of a ceramic substrate. The manner of forming a printed land on the ceramic substrate is to apply or print a first electrically conductive pattern onto the ceramic surface. Surface portions of this electrically conductive pattern are electrically separated from the remaining surface portions of the electrically conductive pattern by preferably a dielectric material such as glass which cannot be wetted or adhered to by solder. The ceramic substrate is then dipped in a solder bath and a solder layer is formed on the electrically conductive printed land pattern but not on the glass dam. Preferably the solder is the same lead-tin mixture used for the pads for the monolithic integrated chip. Each monolithic integrated chip is placed on the solder land formed on the ceramic surface with the lead-tin pads of the chip in contact with the solder lands of the ceramic substrate. By heating the composite assembly of the chip and ceramic substrate each of the lead-tin pads formed on the chip wets the respective lead-tin land on the ceramic substrate and the glass dam serves to prevent shorting between the lead-tin lands and chip. This method of interconnecting a solder pad on a chip with a solder land on a ceramic substrate is described in a patent application entitled "Circuit Structure and Method," Ser. No. 465,034, filed June 18, 1965 and assigned to the same assignee of this invention.

Each cell in the 4 × 4 monolithic memory contains three transistors, two resistors, two di-istors (combined diode and transistor) and an underpass connector. The individual components are described below, and the horizontal dimensions of each component are as follows:

| | |
|---|---|
| 1. Transistor: | |
| Base | 1.5 × 1.4 mils |
| Emitter | 0.6 × 1.0 mils |
| Sub-collector | 2.3 × 1.6 mils |
| 2. Di-istor: | |
| Base | 1.5 × 1.4 mils |
| Emitter | 0.6 × 1.0 mils |
| Diode | 0.6 × 1.4 mils |
| Subcollector | 3.5 × 1.6 mils |
| Diode to Base Spacing = 1.2 mils | |
| 3. Underpass Connector and Resistor: | |
| Resistor | 0.6 × 3.7 mils |
| Underpass | 0.3 × 2.9 mils |
| Subcollector | 4.3 × 5.1 mils |

There is 0.5 mil spacing between all sub-collectors and isolation regions.

The vertical geometry of the 4 × 4 monolithic memory is as follows:

| | |
|---|---|
| TxR Collector Depth | 0.080 mils ± 5% |
| TxR Emitter Depth | 0.063 mils ± 5% |
| TxR Base Width | 0.017 – 0.022 mils |
| Diode Depth | 0.080 mils ± 5% |
| Subcollector sheet resistance | 10.5 ohms per square ± 10% |
| Base Sheet resistance | 155 ohms per square ± 10% |
| Emitter sheet resistance | 10.5 ohms per square ± 10% |
| Epitaxial Thickness | 5.5 – 6.5 microns |
| Epitaxial resistivity | .2 ohms per centimeter ± 10% |

CARRIER LIFETIME KILLER INJECTION

In the past, it was well known in the semiconductor manufacturing art to dope semiconductor structures with carrier lifetime killers such as gold, platinum, etc. in order to reduce carrier lifetime. These carrier lifetime killing impurities formed recombination regions in the semiconductor body thereby decreasing the lifetimes of the carriers to permit either fast transistor switching operations or quick turn off. However, it was discovered that in applying the use of carrier lifetime killers channels or "pipes" were somehow formed between regions of the same conductivity type such as between the diffused emitter and the collector regions of a transistor thereby shorting out these two regions and destroying the operation of the transistor device. In the fabrication of a great multiplicity of discrete or individual transistor devices in a single semiconductor wafer (i.e. 1,100 devices in a wafer), it was not essential that this "pipe" formation phenomena be controlled due to the fact that if some of the devices were inoperable because of the formation of "pipes" there were still a sufficient number of discrete devices available for use and the resultant loss in yield, though significant, did not become critical.

However, in the formation of the monolithic integrated memory structure wherein a multiplicity of active (transistors and diodes) and passive (resistors) devices were fabricated in a single monocrystalline semiconductor body and interconnected to form individual chips having as many as 144 components, it became extremely critical to control the formation of "pipes" since a single shorting "pipe" formed in a densely populated integrated chip structure would destroy not only the operation of the individual device where the pipe was formed but, in addition, would destroy or render inoperative the entire monolithic structure. The yield in producing monolithic integrated structures without solution of this "pipe" problem was approximately zero percent.

Most of the previous gold diffusion operations in the fabrication of discrete or monolithic silicon semiconductor structures usually took place either prior to the emitter type diffusion or right after the emitter type diffusion, but prior to the final oxidation step in the semiconductor manufacturing or fabrication process. The formation of discrete or monolithic semiconductor structures using the teachings of these prior art carrier lifetime killer diffusion techniques did perform a carrier lifetime killing function, however, it was discovered that shorting "pipes" were somehow also formed causing a substantially zero percent yield for densely populated monolithic semiconductor structures.

Referring to FIG. 1G, a final oxidation and emitter drive-in operation is carried out as described above to form the final oxide layer on the surface of the monolithic integrated semiconductor structure after the active and passive devices are formed therein. It is at this critical period in the process that the carrier lifetime killer injection step is performed. The carrier lifetime killers are injected into the wafer through an opening in the oxide preferably in the backside of the wafer. Preferably, a layer of 200 Angstrom units of gold is evaporated on the wafer and the gold is diffused into the monolithic semiconductor structure by a heating operation of 20 minutes at 1,000° C in a non-oxidizing atmosphere such as nitrogen. This gold diffusion operation is followed by an anneal cycle of 2 hours at 560° C in a non-oxidizing atmosphere such as nitrogen which also serves to increase the transistor current gain or $\beta$.

With reference to FIG. 2G, a table is shown relating temperature to the total carrier lifetime killer diffusion time (in minutes), which includes the furnace recovery time due to the fact that the furnace takes time to heat up to its original temperature after the relatively cold wafer or wafers are inserted therein. This table indicates the $\beta$ (transistor current gain) and the $\tau$ (lifetime of carriers — in nanoseconds) for certain temperature and furnace times. The $\beta$ and $\tau$ values shown are the measured values following the anneal cycle described above. The transistor device for the monolithic structure described above for memory applications requires a $\beta$ of greater than 20 and a $\tau$ of less than 10 nanoseconds. Hence, the most optimum or critical furnace time and temperature combination is the carrier lifetime killer diffusion time of 20 minutes at 1,000° C since this provides a value of a $\beta$ of between 30 and 40 and a $\tau$ of between 7.5 to 8 nanoseconds. A marginal value of $\beta$ and $\tau$ is the 20 minute period heat treatment at 1,025° C. Although the 5 minute heat treatment period at 1,025° C. appears to provide satisfactory $\beta$ and $\tau$ values, this period is less desirable due to the fact that the furnace recovery time is approximately 8 minutes which means that consistent $\beta$ and $\tau$ values are difficult to achieve from wafer to wafer since the furnace has not reached the desired temperature level. Hence, in withdrawing some of the wafers from the furnace a few seconds away from time other wafers are removed from the furnace, after the 5 minute diffusion cycle at 1,025° C, the $\beta$ and $\tau$ values will be different for those wafers withdrawn from the furance at the slightly different time periods.

Referring to FIG. 3G, another gold doping injection process is shown in block flow diagram form. In this embodiment, all diffusions and oxidation steps are carried out, as described above, except for the final emitter type diffusion step.

A selected portion of the final oxide layer formed on the wafer surface after the base type diffusion is removed to permit the gold diffusion operation described above. This gold or carrier lifetime killer diffusion operation is carried out in a non-oxidizing atmosphere such as nitrogen or possibly argon.

Finally, the emitter type diffusion operation is carried out, however, this is not followed by an oxidation step and drive-in of the emitter diffused impurities can be achieved in a non-oxidizing atmosphere such as nitrogen. This alternate embodiment does not require an anneal cycle since the emitter type diffusion follows the injection of carrier lifetime killers into the wafer. Furthermore, higher gold diffusion temperatures can be used which would reduce the carrier lifetimes since the emitter diffusion follows the gold diffusion step. Hence, the gold diffusion step does not degrade circuit performance or damage the structure of the semiconductor device.

LOW RESISTIVITY SEMICONDUCTOR UNDERPASS

CONNECTOR

In fabricating integrated structures, a significant savings in cost is realized if all the connectors or lands that are formed on an insulating layer disposed over the surface of the integrated structure are in one plane. This is an extremely difficult goal to achieve when working with very densely populated integrated structures employing large numbers of active and passive devices. Consequently, in order to prevent the use of multiple layers of conductive lands separated by insulating layers, it is necessary to provide low resistivity underpass connectors in the integrated structure which connect up devices in the integrated structure and also permit the overpass of a multiplicity of connectors above the underpass region.

In the past, various underpass schemes were proposed which were formed by using either a base or emitter diffused region formed in a discrete area of the integrated semiconductor structure so as to provide an underpass between devices when a pair of spaced contacts were connected thereto. One problem associated with such a method of forming an underpass structure is that the conductivity of the underpass region and, hence, its resistivity was dependent on the conductivity of the base or emitter diffusion that was used to form the devices in the integrated semiconductor structure. Hence, changes in the conductivity of the diffused base or emitter diffusions resulted in resistivity changes in the connector. Accordingly, in the fabrication of an integrated semiconductor structure it is desirable to form a low resistivity connector which can be made without extra process steps and yet be independently formed with respect to the formation of the active or passive devices in the integrated semiconductor structure. In addition, it is desirable to form a low resistivity underpass connector which will have a high figure of merit that is defined as the reciprocal of the resistance times the capacitance. Therefore, by having a connector with a very low resistance and a very low capacitance a high figure of merit is achieved.

In integrated structures using PN junction isolation techniques to isolate active and passive devices, it is necessary to apply a negative potential to a P type isolating region or a positive potential to an N type isolating region to create the essential reverse bias condition for isolation. It is, therefore, important to provide a connector that is electrically isolated from the isolating regions of the integrated structure in such a manner so as to permit the connector voltage to be at a potential value that can be either below or above the potentials applied to the isolation region.

Furthermore, the connector should occupy as small a planar area as possible thereby reducing the amount of semiconductor area required therefor and this will also result in a reduction in capacitance thereby increasing the figure of merit.

In the formation of underpass connectors, it is essential to prevent possible shorting of the connector region to a region of the same type conductivity as the connector. Accordingly, the use of a connector formed by either a base or emitter diffusion or a combination of both diffusions in an epitaxial region does not provide a good connector because the resistivity value is usually above what is needed to provide optimum conducting properties and furthermore, since the connector region is formed by a diffusion operation this could result in "-pipes" being formed which could create shorting to a region of the same conductivity type as the connector. "Pipes" is the term of the art referring to channels of diffused material formed usually in fault areas of a semiconductor structure which reach undesired regions in the structure.

Although for the purpose of describing this connector reference is made to a semiconductor configuration wherein a $P^-$ type region is utilized as the substrate and subsequent semiconductor regions of the composite semiconductor structure are formed in the conductivity types shown in the drawings, it is readily apparent that the same regions shown in the drawings can be of opposite type conductivities and furthermore, some of the operations which are described as diffusion operations can be made by epitaxial growth and some of the epitaxial growth regions can also be fabricated by diffusion techniques. A separate patent application entitled "Low Resistivity Semiconductor Underpass Connector and Fabrication Method Therefor" assigned to the same assignee of this invention and filed concurrently herewith discloses and claims the underpass connector.

Figure 1C:
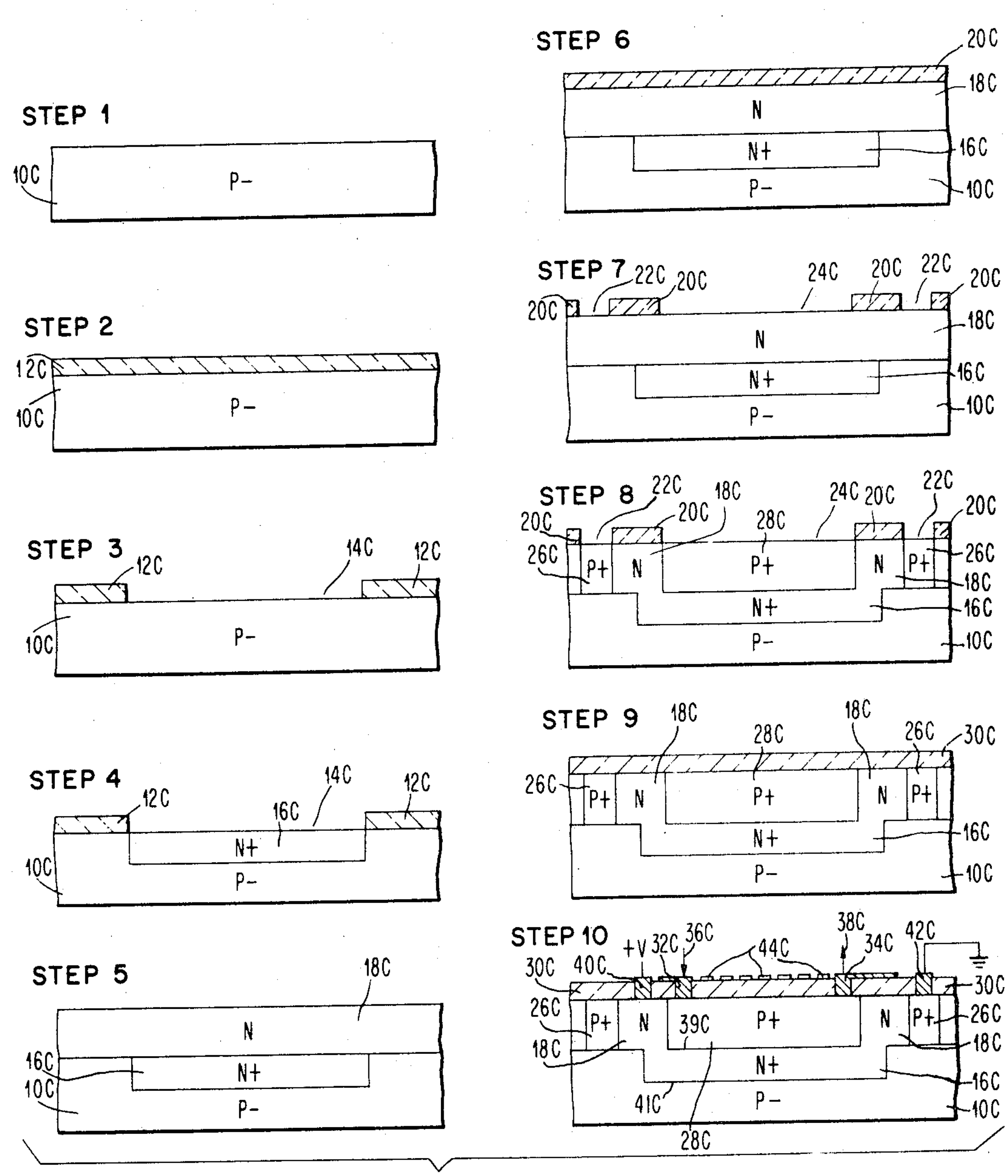
FIG. 1C is a flow diagram in cross section of the steps in fabricating the underpass connector for the monolithic integrated structure of this invention.

Referring to FIG. 1C, step 1 depicts a substrate 10C of $P^-$ type conductivity, preferably having a resistivity of 10 to 20 ohms-centimeter. The substrate 10C is preferably a monocrystalline silicon structure which can be fabricated by conventional techniques such as by pulling a silicon semiconductor member from a melt containing the desired impurity concentration and then slicing the pulled member into a plurality of wafers. The substrate 10C is a portion of one such wafer.

Referring to step 2, an oxide coating 12C preferably of silicon dioxide and having a thickness of 5,200 Angstrom units is either thermally grown or deposited by pyrolytic deposition.

In step 3, by standard photolithographic masking and etching techniques a photoresist layer (not shown) is deposited onto the substrate including the surface of the oxide layer 12C and by using the photoresist layer as a mask a surface region 14C is exposed on the surface of the substrate 10C by etching away the desired portion of the $SiO_2$ layer 12C with a buffered HF solution. The photoresist layer is then removed to permit further processing.

In step 4, a diffusion operation is carried out to diffuse into the surface 14C of the substrate 10C an $N^+$ type region 16C having a $C_o$ of $2 \times 10^{20}cm^{-3}$ of N type majority carriers. The oxide layer 12C serves as a mask to prevent the $N^+$ region 16C from being formed across the entire surface of the substrate 10C. Preferably, the diffusion operation is carried out in an evacuated quartz capsule using degenerate arsenic doped silicon powder. As an alternative variation, the $N^+$ region 16C can be formed by etching out a channel in the $P^-$ type substrate 10C and then subsequently epitaxially growing an $N^+$ region.

In step 5, after removing the oxide layer 12C with a buffered HF solution, a region 18C of N type conductivity, preferably having a resistivity of 0.2 ohms per centimeter, is epitaxially grown on the surface of the substrate. The epitaxial region 18C is an arsenic doped layer approximately 5.5 to 6.5 microns thick. In actual device fabrication, the arsenic impurities in the region 16C, which is now buried, outdiffuses about one micron during the epitaxial deposition.

In step 6, an oxide layer 20C approximately 5,200 Angstrom units thick is formed on the surface of the epitaxially grown region 18C either by the thermal oxidation process, by pyrolytic deposition, or by RF sputtering techniques.

In step 7, an opening 22C and a central opening 24C are formed in the oxide layer by standard photolithographic masking and etching techniques using a photoresist layer as a mask and a buffered HF solution to remove the desired oxide portions. The structure is now prepared for the subsequent diffusion operation.

In step 8, a $P^+$ diffusion is carried out, preferably using a boron source, to form surrounding region 26C and central region 28C in the N type epitaxially grown region 18C. This diffusion operation is carried out at a temperature of 1,200° C for a period of 95 minutes forming a $C_o$ (surface concentration) of $5 \times 10^{20}cm^{-3}$. It is evident from the drawing that the $P^+$ region 28C extends continuously from the surface of the semiconductor structure to the $N^+$ buried low resistivity region 16C. The $N^+$ buried region acts as a barrier region which prevents the $P^+$ region 28C from going through to the substrate region 10C. Furthermore, it is evident that the $P^+$ diffused region 28C will have a low resistivity surface region which extends downwardly from the surface of the semiconductor structure and across to the inner limit of the N type region 18C. It is this optimum high conductivity or low resistivity region that permits the subsequent formation of a low resistivity underpass connector in the semiconductor region 28C.

In step 9, an oxide layer 30C preferably having a thickness of about 4,300 Angstrom units is thermally grown on the substrate surface after the active and passive devices are formed. This step is necessary to permit the subsequent formation of contacts to the various conductivity regions of the semiconductor structure.

In step 10, by using photolithographic masking and etching techniques, a pair of holes are opened up in the oxide layer 30C above the $P^+$ central region 28C to permit the formation of metal ohmic contacts 32C and 34C. The ohmic contacts 32C and 34C are preferably formed by evaporating a layer of aluminum and then subtractively removing undesired portions to leave the desired metal land pattern on the surface of the oxide layer 30C. Arrows 36C and 38C respectively show the current flow through contact 32C across the low resistivity portion of the semiconductor region 28C and up through the contact 34C. A further ohmic contact 40C is made, through an opening formed in the oxide layer 30C, to the N type region 18C which surrounds the central $P^+$ region 28C. This contact 40C permits the application of a positive voltage to the N type region 18C which acts as a reverse bias to the PN junctions 39C and 41C defined by the N,$N^+$ regions 18C, 16C and the $P^+$ regions 28C and 26C and $P^-$ region 10C. The $P^+$ region 26C, which surrounds the N type region 18C, merges into the substrate region 10C so that an ohmic contact 42C to the region 26C permits the entire P type region (includes regions 26C and 10C) to be placed at a reverse bias potential, such as ground. PN junction 41C separates P type regions 26C and 10C from N type regions 18C and 16C. PN junction 39C separates $P^+$ region 28C from N type regions 18C and 16C.

In this manner a low resistivity semiconductor underpass structure is provided which permits a plurality of insulating conductors or lands 44C formed on the oxide layer 30C to pass between the contacts 32C and 34C of the underpass connector. The conductors 44C are connected up to other areas or devices of the integrated structure of which the underpass connector is a part thereof. Hence, the conductors 44C are substantially perpendicular to the lands connected to ohmic contacts 32C and 34C. The central $P^+$ region 28C is isolated by N type regions 18C and 16C and hence can receive a positive potential as long as it is not higher than the positive potential applied to the N type regions 18C and 16C. If the semiconductor regions of the underpass connector shown in the drawings were of opposite type conductivity, then the signs of the potentials applied to the semiconductor regions would also be reversed.

Figure 2C:
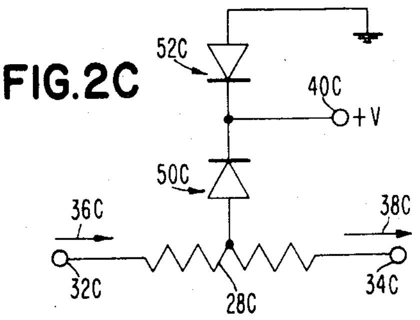
FIG. 2C is a schematic view of the circuit represented by the connector of FIG. 1C.

Referring to FIG. 2C, a schematic view is shown of the isolated semiconductor underpass connector of step 10 of FIG. 1C. Arrows 36C and 38C of FIG. 2C correspond to arrows 36C and 38C shown in FIG. 1C. Consequently, the current input is applied to the ohmic contact 32C and the output is taken out from the ohmic contact 34C with the annular region 28C shown in FIG. 2C as a resistor of very low value (approximately 2 ohms per square). Ohmic contact 40C connected to the N type region 18C is shown in FIG. 2C as being at a positive potential and electrically connected between two diodes 50C and 52C. Diode 50C is the diode configuration formed by the $P^+$ type region 28C and the N type regions 18C and 16C. Diode 52C is formed by the N type regions 18C and 16C and the P type regions 26C and 10C. As shown in this figure, the P type region which includes the substrate region 10C and the $P^+$ region 26C is connected to a reverse bias potential, such as ground.

Figure 3C:
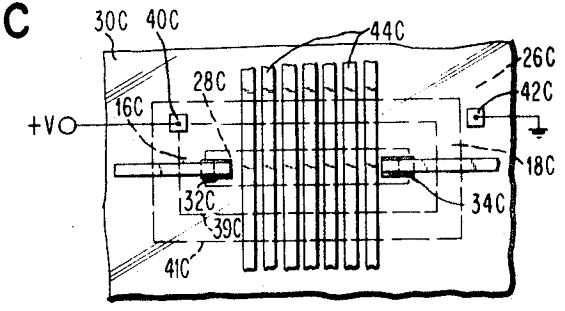
FIG. 3C is a partial top view showing the various semiconductor regions by phantom lines of the connector.

FIG. 3C shows a top view of the underpass connector of step 10 of FIG. 1C with the broken or phantom lines identifying each of the semiconductor regions making up the underpass connector. As seen from this figure, the $N^+$ buried region 16C has a greater width and length than the width and length of the contacting $P^+$ region 28C. Furthermore, the $P^+$ region 28C is rectangular having a substantially longer length than its width so as to permit as many conductors 44C as desired to cross over the underpass region between contacts 32C and 34C. If desired, a base type diffusion can be added in the vicinity of the diffused regions surrounding contacts 32C and 34C to increase the area for making contact to the region 28C. This would provide a substantially dumbbell-shaped configuration instead of the rectangular configuration shown in FIG. 3C.

In a specific example of the low resistivity, semiconductor, underpass connector described above, the $P^-$ substrate region 10C had a depth of approximately 8 mils; the epitaxially grown region had a depth of approximately 5 microns, and consequently, the $P^+$ regions 26C and 28C also had a depth of approximately 5 microns. The depth of the $N^+$ buried region 16C was approximately 2 microns. The width of the $P^+$ region 28C was approximately 0.3 mils and the length in some applications was 1 mil and in other applications was as large as 10 mils. The width of the N region 18C between the $P^+$ region 28C and the $P^+$ region 26C was approximately 0.7 mils. The width of the $P^+$ region 26C was approximately 2 mils and the width of the $P^+$ region 28C was approximately 0.3 mils. The $P^+$ region 28C is the $P^+$ isolation region formed about active or passive devices in the integrated semiconductor structure. The $N^+$ region 16C prevents pipes from the diffused $P^+$ region 28C to reach the $P^-$ substrate region 10C.

DI - ISTOR

(Diode Transistor)

Although for the purpose of describing this invention reference is made to a semiconductor configuration wherein a $P^-$ type region is utilized as the substrate and subsequent semiconductor regions of the composite semiconductor structure are formed in the conductivity types shown in the drawings, it is readily apparent that the same regions shown in the drawings can be of opposite type conductivities and furthermore, some of the operations which are described as diffusion operations can be made by epitaxial growth and some of the epitaxial growth regions can also be fabricated by diffusion techniques.

Figures 1D, 1R:
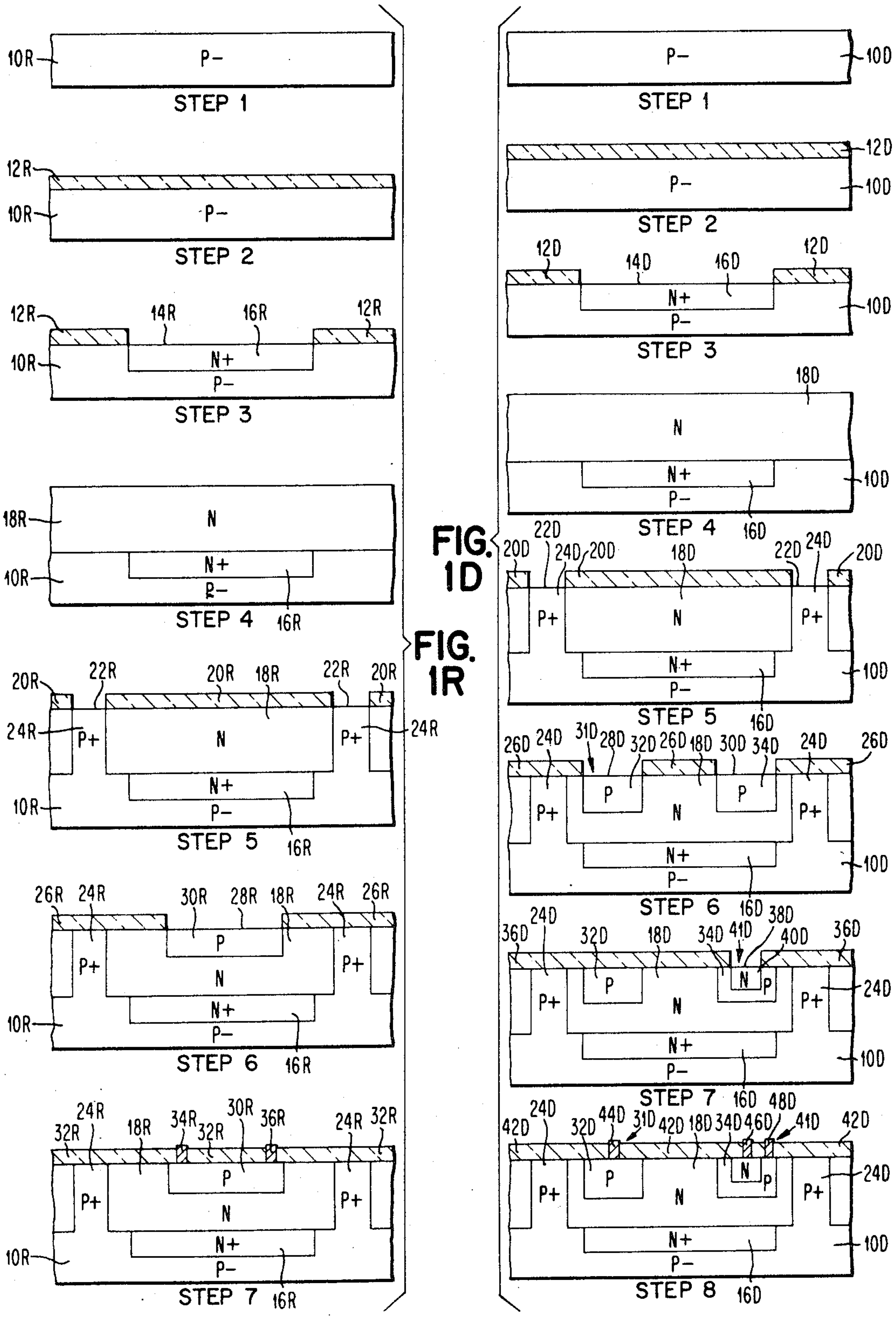
FIG. 1D is a flow diagram in cross section of the steps for the fabrication of the di-istor (diode-transistor) of the monolithic integrated structure of this invention.
FIG. 1R is a flow diagram in cross section of the steps for the fabrication of the resistor of the monolithic integrated structure of this invention.

Referring to FIG. 1D, step 1 depicts a substrate 10D of $P^-$ type conductivity, preferably having a resistivity of 10 to 20 ohms-centimeter. The substrate 10D is preferably a monocrystalline silicon structure which can be fabricated by conventional techniques such as by pulling a silicon semiconductor member from a melt containing the desired impurity concentration and then slicing the pulled member into a plurality of wafers. The substrate 10D is a portion of one such wafer.

Referring to step 2, an oxide coating 12D preferably of silicon dioxide and having a thickness of 5,200 Angstrom units is either thermally grown or formed by pyrolytic deposition. Alternatively, an RF sputtering technique, as described in a patent application identified as Ser. No. 428,733, filed Jan. 28, 1965 in the names of Davidse and Maissel and assigned to the same assignee as this invention, can be used to form the silicon dioxide layer 12D.

In step 3, by standard photolithographic masking and etching techniques a photoresist layer (not shown) is deposited onto the substrate including the surface of the oxide layer 12D and by using the photoresist layer as a mask a surface region 14D is exposed on the surface of the substrate 10D by etching away the desired portion of the $SiO_2$ layer 12D with a buffered HF solution. The photoresist layer is then removed to permit further processing. A diffusion operation is carried out to diffuse into the surface 14D of the substrate 10D an $N^+$ type region 16D having a $C_o$ of $2 \times 10^{20}$ $cm^{-3}$ of N type majority carriers. The oxide layer 12D serves as a mask to prevent the $N^+$ region 16D from being formed across the entire surface of the substrate 10D. Preferably, the diffusion operation is carried out in an evacuated quartz capsule using degenerate arsenic doped silicon powder. As an alternative variation, the $N^+$ region 16D can be formed by etching out a channel in the $P^-$ type substrate 10D and then subsequently epitaxially growing an $N^+$ region.

In step 4 after removing the oxide layer 12D with a buffered HF solution, a region 18D of N type conductivity, preferably having a resistivity of 0.2 ohms per centimeter, is epitaxially grown on the surface of the substrate. The epitaxial region 18D is an arsenic doped layer approximately 5.5 to 6.5 microns thick. In actual device fabrication, the arsenic impurities in the region 16D, which are now buried, out diffuse about 1 micron during the epitaxial deposition.

In step 5, after a post epitaxial oxidation forms oxide layer 20D, continuous opening 22D is formed by photolithographic masking and etching techniques. Then P type isolation diffusion step is carried out, preferably using a boron source, to form $P^+$ isolation regions 24D in the N type epitaxially grown layer. This diffusion operation is carried out at a temperature of 1,200°C. for a period of 95 minutes forming a $C_o$ (surface concentration) of $5 \times 10^{20}$ $cm^{-3}$. It is evident that the $P^+$ diffused regions will each have a low resistivity surface region which extends downwardly from the surface of the semiconductor structure. In forming isolation diffusions, the diffused $P^+$ type regions reach and become continuous with the original $P^-$ substrate 10D.

In step 6 another oxide layer 26D is formed after the isolation or connector diffusion operation. Oxide layer 26D is preferably 4,300 Angstrom units thick and can be formed by a thermal oxidation process such as by heating at 1,050° C for a period of 5 minutes in dry $O_2$ followed by 15 minutes in steam and 5 minutes in dry $O_2$.

A photoresist coating is applied to the surface of this oxide layer and by photolithographic masking and etching techniques two desired portions 28D and 30D of the $SiO_2$ layer are removed using a buffered HF solution.

A base type diffusion is now carried out preferably using boron as the impurity source. This diffusion operation is for 70 minutes at 1,075° C and forms P type regions 32D and 34D having an impurity surface concentration of $5 \times 10^{19}$ $cm^{-3}$. Diode 31D is formed by the base diffusion step since this P type diffusion forms a P type region 32D in a portion of the same N type epitaxially grown isolated region 18D near the base region of the transistor.

In the step 7, the base diffusion step is followed by a simultaneous reoxidation and drive-in operation. Another layer 36D of $SiO_2$ is thereby grown having a thickness of about 3,600 Angstrom units on the base and diode regions. During this heat treatment, the boron impurities are redistributed thereby increasing the junction depth and lowering the $C_o$. The oxidation drive-in cycle is 25 minutes in dry $O_2$ and 10 minutes in steam followed by 15 minutes in dry $O_2$ at 1,150° C.

In forming transistor device 37D, a photoresist coating is applied over the oxide layer and by photolithographic masking and etching operations a portion 38D of this oxide layer is removed over the diffused base region to permit an emitter region 40D to be formed by a diffusion operation.

The N type emitter region is formed in the P type base region 34D using preferably a phosphorous impurity source such as $POCl_3$ and heating the wafer in an atmosphere containing 700 parts per million of $POCl_3$ at a temperature of 970° C and for a period of 35 minutes. Since the base and emitter type regions are formed over the buried $N^+$ region 16D, the buried $N^+$ region acts as a buried low resistivity sub-collector for the transistor device and also functions to provide an electrical connection path for the diode current.

Following the emitter diffusion operation, an emitter drive in and oxidation heat treatment step is performed. The drive in cycle is 5 minutes dry $O_2$ followed by 55 minutes steam and a period of time in a dry $O_2$ atmosphere (depending on the depth of the collector region) at a temperature of 970° C.

By using photolithographic masking and etching techniques, holes are opened up in the oxide layer 42D in selected areas to fabricate the desired circuit. A layer of aluminum is evaporated over the entire wafer surface and portions of this layer are etched away to produce the desired interconnection pattern. The evaporated layer of aluminum has a thickness of 6,000 Angstrom units which was formed by depositing aluminum at a rate of 45 Angstrom units a second in a vacuum of $5 \times 10^{-6}$ torr. 1,500 Angstrom units are deposited at a wafer temperature of 200° C and the remaining 4,500 Angstrom units at a wafer temperature less than 100° C. A layer of photoresist is then applied to the wafer, dried, exposed, developed, and fixed. The aluminum interconnections are formed by a subtractive etching operation using a warm solution of $H_3PO_4 + HNO_3 + H_2O$. The photoresist layer is stripped off and the wafer is cleaned and dried.

The wafers are sintered in a nitrogen atmosphere at 450° C for 15 minutes to permit the aluminum to produce good ohmic contacts to the contacted semiconductor regions of the wafer. In this manner ohmic contacts 44D, 46D, and 48D are formed to regions 32D, 40D, and 34D, respectively to provide a combined diistor or diode transistor device.

RESISTOR

Although for the purpose of describing this resistor reference is made to a semiconductor configuration wherein a $P^-$ type region is utilized as the substrate and subsequent semiconductor regions of the composite semiconductor structure are formed in the conductivity types shown in the drawings, it is readily apparent that the same regions shown in the drawings can be of opposite type conductivities and furthermore, some of the operations which are described as diffusion operations can be made by epitaxial growth and some of the epitaxial growth regions can also be fabricated by diffusion techniques.

Referring to FIG. 1R, step 1 depicts a substrate 10R of $P^-$ type conductivity, preferably having a resistivity of 10 to 20 ohms-centimeter. The substrate 10R is preferably a monocrystalline silicon structure which can be fabricated by conventional techniques such as by pulling a silicon semiconductor member from a melt containing the desired impurity concentration and then slicing the pulled member into a plurality of wafers. The substrate 10R is a portion of one such wafer.

Referring to step 2, an oxide coating 12R preferably of silicon dioxide and having a thickness of 5,200 Angstrom units is either thermally grown by conventional heating in a wet atmosphere at 1,050° C for 60 minutes or by pyrolytic deposition of an oxide layer on the surface of the substrate 10R. Alternatively, an RF sputtering technique, as described in a patent application identified as Ser. No. 428,733, filed Jan. 28, 1965 in the names of Davidse and Maissel and assigned to the same assignee as this invention, can be used to form the silicon dioxide layer 12R.

In step 3, by standard photolithographic masking and etching techniques a photoresist layer (not shown) is deposited onto the substrate including the surface of the oxide layer 12R and by using the photoresist layer as a mask a surface region 14R is exposed on the surface of the substrate 10R by etching away the desired portion of the $SiO_2$ layer 12R with a buffered HF solution. The photoresist layer is then removed to permit further processing. A diffusion operation is carried out to diffuse into the surface 14R of the substrate 10R an $N^+$ type region 16R having a $C_o$ of $2 \times 10^{20}cm^{-3}$ of N type majority carriers. The oxide layer 12R serves as a mask to prevent the $N^+$ region 16R from being formed across the entire surface of the substrate 10R. Preferably, the diffusion operation is carried out in an evacuated quartz capsule using degenerate arsenic doped silicon powder. As an alternative variation, the $N^+$ region 16R can be formed by etching out a channel in the $P^-$ type substrate 10R and then subsequently epitaxially growing an $N^+$ region.

In step 4 after removing the oxide layer 12R with a buffered HF solution, a region 18R of N type conductivity, preferably having a resistivity of 0.2 ohms per centimeter, is epitaxially grown on the surface of the substrate. The epitaxial region 18R is an arsenic doped layer approximately 5.5 to 6.5 microns thick. In actual device fabrication, the arsenic impurities in the region 16R, which are now buried, outdiffuse about one micron during the epitaxial deposition.

In step 5, an oxide layer 20R approximately 5,200 Angstrom units thick is formed on the surface of the epitaxially grown region 18R either by the thermal oxidation process, by pyrolytic deposition, or by RF sputtering techniques. A continuous opening 22R is formed in the oxide layer 20R by photolithographic masking and etching techniques using a photoresist layer as a mask and a buffered HF solution to remove the desired oxide portions. The structure is now prepared for the subsequent isolation diffusion operation. A $P^+$ diffusion is carried out, preferably using a boron source, to form surrounding isolation region 24R. This diffusion operation is carried out at a temperature of 1,200° C for a period of 95 minutes forming a $C_o$ (surface concentration) of $5 \times 10^{20}cm^{-3}$. It is evident from the drawing that the $P^+$ isolation region 24R extends continuously from the surface of the semiconductor structure to the P type substrate region 10R. Furthermore, it is evident that the $P^+$ diffused region 24R will have a low resistivity surface region which extends downwardly from the surface of the semiconductor structure.

In step 6, another oxide layer 26R is formed after the isolation or connector diffusion operation. This oxide layer is preferably 4,300 Angstrom units thick and can be formed by a thermal oxidation process such as by heating at 1,050° C for a period of 5 minutes in dry $O_2$ followed by 15 minutes in steam and 5 minutes in dry $O_2$.

A photoresist coating is applied to the surface of this oxide layer and by photolithographic masking and etching techniques the desired portion of the $SiO_2$ layer is removed using a buffered HF solution. Opening 28R in the oxide layer 26R permits a subsequent base type diffusion.

A base or resistor type diffusion is now carried out preferably using boron as the impurity source to form resistor region 30R. This diffusion operation is for 70 minutes at 1,075° C and forms P type regions having an impurity surface concentration of $5 \times 10^{19}cm^{-3}$.

In step 7, the base or resistor diffusion step is followed by a simultaneous reoxidation and drive-in operation. Another layer 32R of $SiO_2$ is thereby grown. During this heat treatment, the boron impurities are redistributed thereby increasing the junction depth and lowering the $C_o$. The oxidation drive-in cycle is 25 minutes in dry $O_2$ and 10 minutes in steam followed by 15 minutes in dry $O_2$ at 1,150° C.

In forming the transistor devices, the thickness of the oxide layer 32R is increased due to the oxidation step following the emitter region formation. By photolithographic masking and etching operations portions of this oxide layer are removed over the diffused resistor region.

A pair of holes are opened up in the oxide layer 32R above the P type resistor region 30R to permit the formation of metal ohmic contacts 34R and 36R. The ohmic contacts 34R and 36R are preferably formed by evaporating a layer of aluminum and then subtractively removing undesired portions to leave the desired metal land pattern on the surface of the oxide layer 32R. Hence, the resistor structure is formed.

TRANSISTOR

Although for the purpose of describing the transistor reference is made to a semiconductor configuration wherein a $P^-$ type region is utilized as the substrate and subsequent semiconductor regions of the composite semiconductor structure are formed in the conductivity type shown in the drawings, it is readily apparent that the same regions shown in the drawings can be of opposite type conductivities and furthermore, some of the operations which are described as diffusion operations can be made by epitaxial growth and some of the epitaxial growth regions can also be fabricated by diffusion techniques.

Figures 1T, 6A:
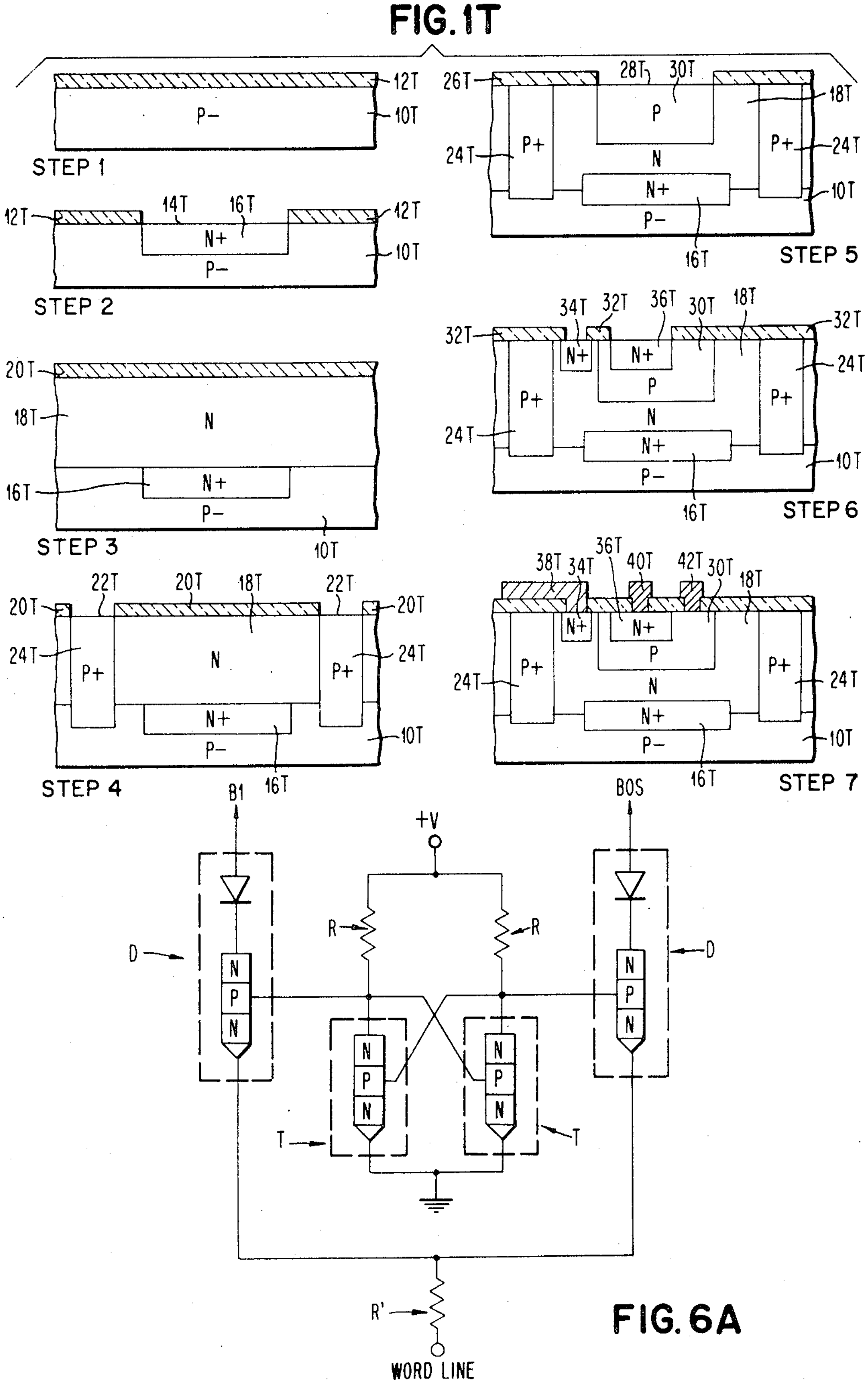
FIG. 1T is a flow diagram in cross section of the steps for the fabrication of the transistor of the monolithic integrated structure of this invention.
FIG. 6A is an electrical schematic view of a single two dimensional memory cell for application into a monolithic memory structure.

Referring to FIG. 1T, step 1 depicts a substrate 10T of $P^-$ type conductivity, preferably having a resistivity of 10 to 20 ohms-centimeter. The substrate 10T is preferably a monocrystalline silicon structure which can be fabricated by conventional techniques such as by pulling a silicon semiconductor member from a melt containing the desired impurity concentration and then slicing the pulled member into a plurality of wafers. The substrate 10T is a portion of one such wafer. An oxide coating 12T preferably of silicon dioxide and having a thickness of 5,200 Angstrom units is either thermally grown or deposited by pyrolytic deposition. Alternatively, an RF sputtering technique, as described in a patent application identified as Ser. No. 428,733, filed Jan. 28, 1965 in the names of Davidse and Maissel and assigned to the same assignee as this invention, can be used to form the silicon dioxide layer 12T.

In step 2, by standard photolithographic masking and etching techniques a photoresist layer (not shown) is deposited onto the substrate including the surface of the oxide layer 12T and by using the photoresist layer as a mask a surface region 14T is exposed on the surface of the substrate 10T by etching away the desired portion of the $SiO_2$ layer 12T with a buffered HF solution. The photoresist layer is then removed to permit further processing. A diffusion operation is carried out to diffuse into the surface 14T of the substrate 10T and $N^+$ type region 16T having a $C_o$ of $2 \times 10^{20}cm^{-3}$ of N type majority carriers. The oxide layer 12T serves as a mask to prevent the $N^+$ region 16T from being formed across the entire surface of the substrate 10T. Preferably, the diffusion operation is carried out in an evacuated quartz capsule using degenerate arsenic doped silicon powder. As an alternative variation, the $N^+$ region 16T can be formed by etching out a channel in the $P^-$ type substrate 10T and then subsequently epitaxially growing an $N^+$ region.

In step 3, after removing the oxide layer 12T with a buffered HF solution, a region 18T of N type conductivity, preferably having a resistivity of 0.2 ohms per centimeter, is epitaxially grown on the surface of the substrate. The epitaxial region 18T is an arsenic doped layer approximately 5.5 to 6.5 microns thick. In actual device fabrication, the arsenic impurities in the region 16T, which are now buried, outdiffuse about 1 micron during the epitaxial deposition. An oxide layer 20T approximately 5,200 Angstrom units thick is formed on the surface of the epitaxially grown region 18T either by the thermal oxidation process, by pyrolytic deposition, or by RF sputtering techniques.

In step 4, a continuous opening 22T is formed in the oxide layer by standard photolithographic masking and etching techniques using a photoresist layer as a mask and a buffered HF solution to remove the desired oxide portions. The structure is not prepared for the subsequent isolation diffusion operation. A $P^+$ diffusion is now carried out, preferably using a boron source, to form surrounding region 24T in the N type epitaxially grown region 18T. This diffusion operation is carried out at a temperature of 1,200° C for a period of 95 minutes forming a $C_o$ (surface concentration) of $5 \times 10^{20}$ $cm^{-3}$. It is evident that the $P^+$ isolation diffused region 24T will have a low resistivity surface region which extends downwardly from the surface of the semiconductor structure and the full isolation region extends continuously from the P type substrate region 10T to the surface of the semiconductor structure.

In step 5, an oxide layer 26T preferably is thermally grown on the semiconductor surface. By using photolithographic masking and etching techniques a hole is opened up in the oxide layer 26T above the isolated N type region 18T so as to permit a base type diffusion. A base type diffusion operation is carried out through semiconductor surface portion 28T to form a base region 30T. Boron is used as the impurity source and this diffusion operation is for 70 minutes at 1,075° C and forms a P type region having an impurity surface concentration of $5 \times 10^{19}cm^{-3}$.

In step 6, the base diffusion step is followed by a simultaneous reoxidation and drive-in operation. Another layer 32T of $SiO_2$ is thereby grown having a thickness of about 3,600 Angstrom units. During this heat treatment, the boron impurities are redistributed thereby increasing the junction depth and lowering the $C_o$. The oxidation drive-in cycle is 25 minutes in dry $O_2$ and 10 minutes in steam followed by 15 minutes in dry $O_2$ at 1,150° C.

A photoresist coating is applied over the oxide layer 32T and by photolithographic masking and etching operations two portions of this oxide layer are removed to permit emitter type regions to be formed by a diffusion operation. One $N^+$ emitter type region 34T is formed in the N type collector region 18T to provide a good electrical contact region. An $N^+$ emitter region 36T is also formed in the base region 30T.

The N type emitter regions are formed in the P type base regions using preferably a phosphorous impurity source such as $POCl_3$ and heating the wafer in an atmosphere containing 700 parts per million of $POCl_3$ at a temperature of 970° C and for a period of 35 minutes. Preferably, the emitter and base regions are formed over the buried $N^+$ region to permit this region to act as a buried low resistivity sub-collector.

After an oxide layer is formed during the emitter drive-in cycle the gold diffusion operation is performed. By using photolithographic masking and etching techniques, holes are opened up in the oxide layer in selected areas to fabricate the desired circuit. A layer of aluminum is evaporated over the entire wafer surface and portions of this layer are etched away to produce the desired interconnection pattern. The evaporated layer of aluminum has a thickness of 6,000 Angstrom units. A layer of photoresist is then applied to the wafer, dried, exposed, developed, and fixed. The aluminum interconnections are formed by a subtractive etching operation using a warm solution of $H_3PO_4 + HNO_3 + H_2O$. The photoresist layer is stripped off and the wafer is cleaned and dried.

The wafers are sintered in a nitrogen atmosphere at 450° C for 15 minutes to permit the aluminum to produce good ohmic contacts to the contacted semiconductor regions of the wafer. Ohmic contacts 38T, 40T and 42T provide electrical connection to the collector 18T, emitter 36T and base 30T regions, respectively.

MASKS

Figure 15:
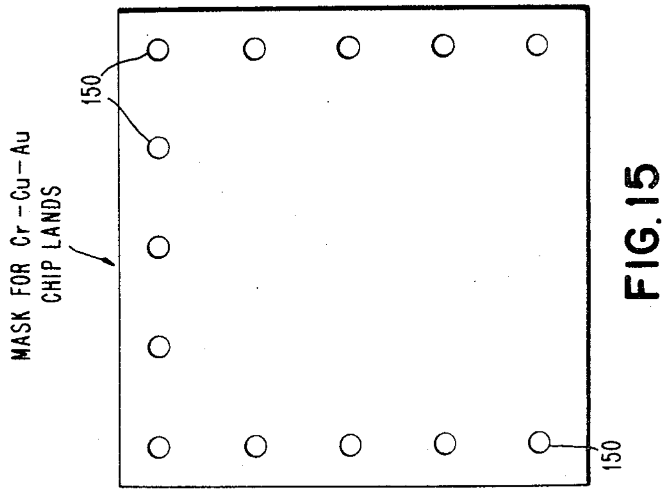
Figure 16:
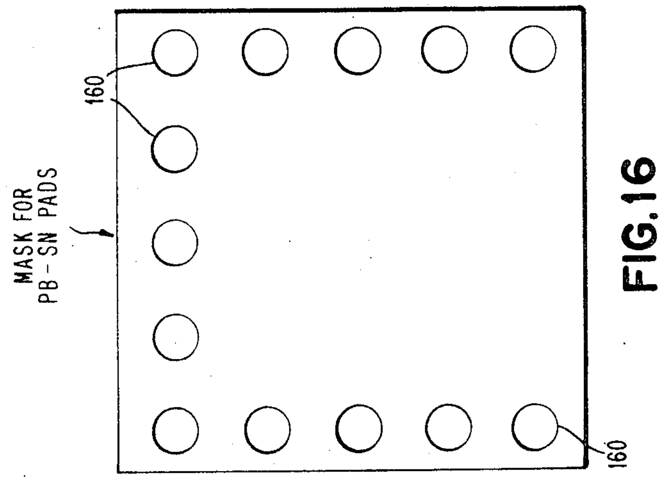
Figures 17, 17A:
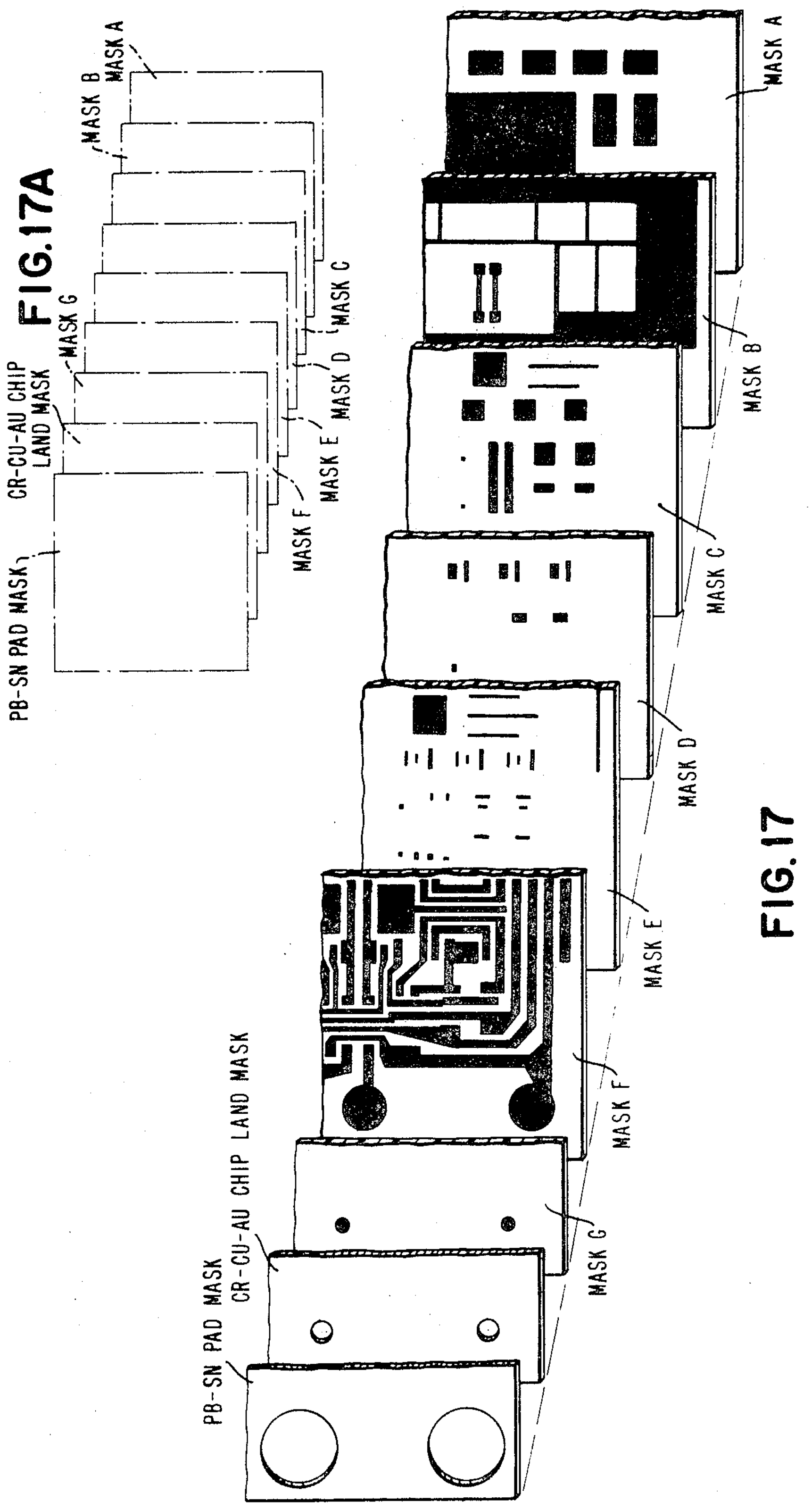
FIG. 17 is a fragmentary exploded perspective view of a portion of each mask in an overlay arrangement.
FIG. 17A is a phantom designation shown in an overlay arrangement of all of the masks used in the fabrication process.

FIGS. 8, 9, 10, 11, 12, 13, 14, 15, 16, 17 and 17A show the metal and glass masks that are used in fabricating the monolithic integrated structure of this invention. FIGS. 17 and 17A show that the masks are placed in alignment in the manner shown during successive photolithographic masking operations.

Figure 8:
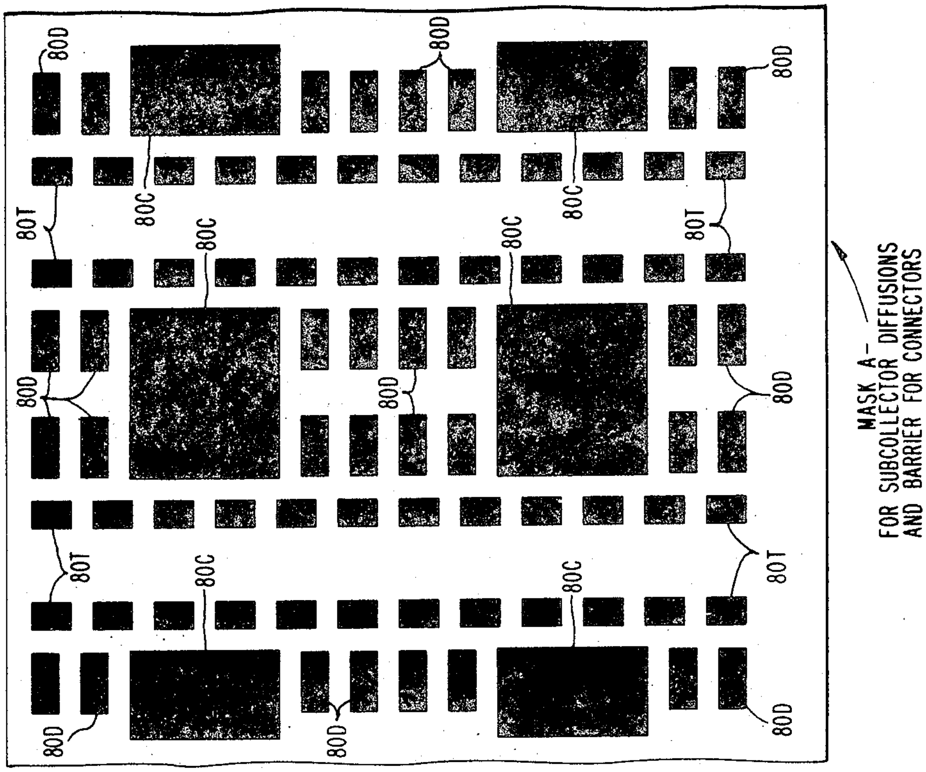
FIGS. 8, 9, 10, 11, 12, 13, 14, 15 and 16 are planar views of the masks used in the fabrication process for making the monolithic integrated structure of this invention.

FIG. 8 is an enlarged view of mask A which is used for sub-collector diffusions for the active and passive devices and also for a barrier for the underpass connectors. The dark patterns in all the masks, including the mask shown in FIG. 8, serve to prevent light from striking a photosensitive emulsion that has been coated on the wafer. Hence, polymerization of the areas of the wafer shielded by the dark areas of the mask is prevented and therefore, these shielded areas are removed during developing. However, the light struck photosensitive areas of the photoresist layer are not removed so as to act as a mask to prevent subsequent chemical etching of the oxide beneath these portions of the photoresist layer. Large black boxes 80C represent the barrier regions for the connector. Hence, the $N^+$ diffusion into the substrate region as defined by the large black boxes 80C serves to act as a barrier region for the subsequent $P^+$ connector diffusion. Furthermore, the subsequent resistor diffused regions are formed in the epitaxial region above the $N^+$ regions defined by big black boxes 80C. Black boxes 80T represent the sub-collector diffused areas for the transistor devices described in FIG. 1T. Black boxes 80D, which are substantially normal to the black boxes 80T, represent the sub-collector regions for the di-istor (diode-transistor) as described in FIG. 1D.

Figure 9:
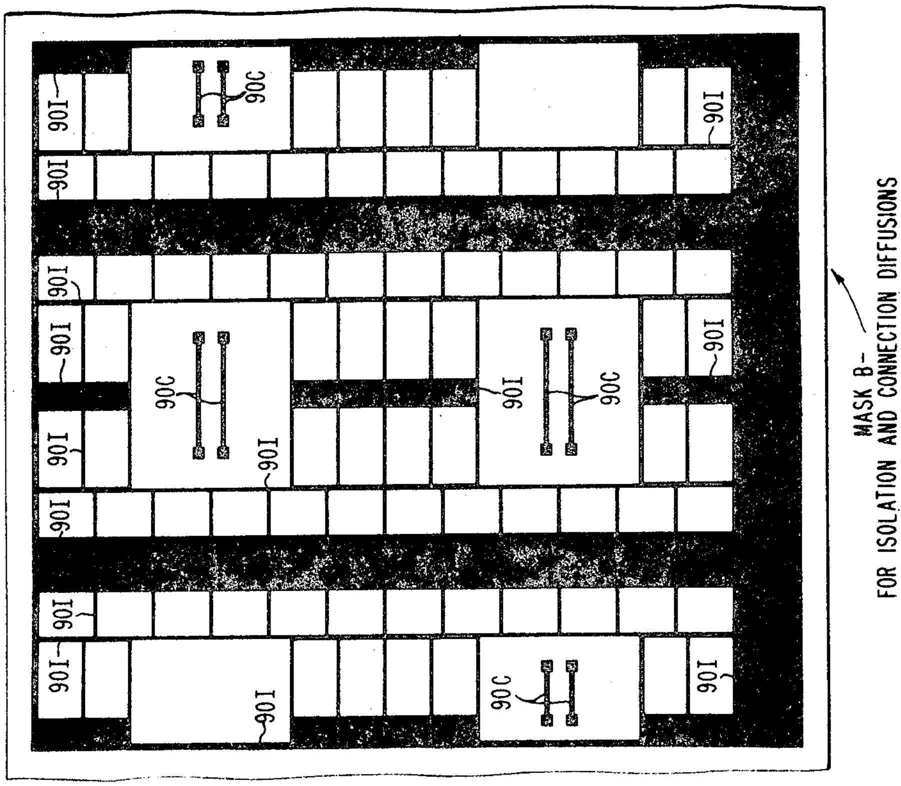

Referring to FIG. 9 which is mask B for isolation and connector diffusions, substantially I-shaped regions 90C depict the connector diffusion regions as described in FIG. 1C. Reference numeral 90I depicts the remaining black areas which define the isolation regions for all the individual devices which include the underpass connector regions.

Figure 10:
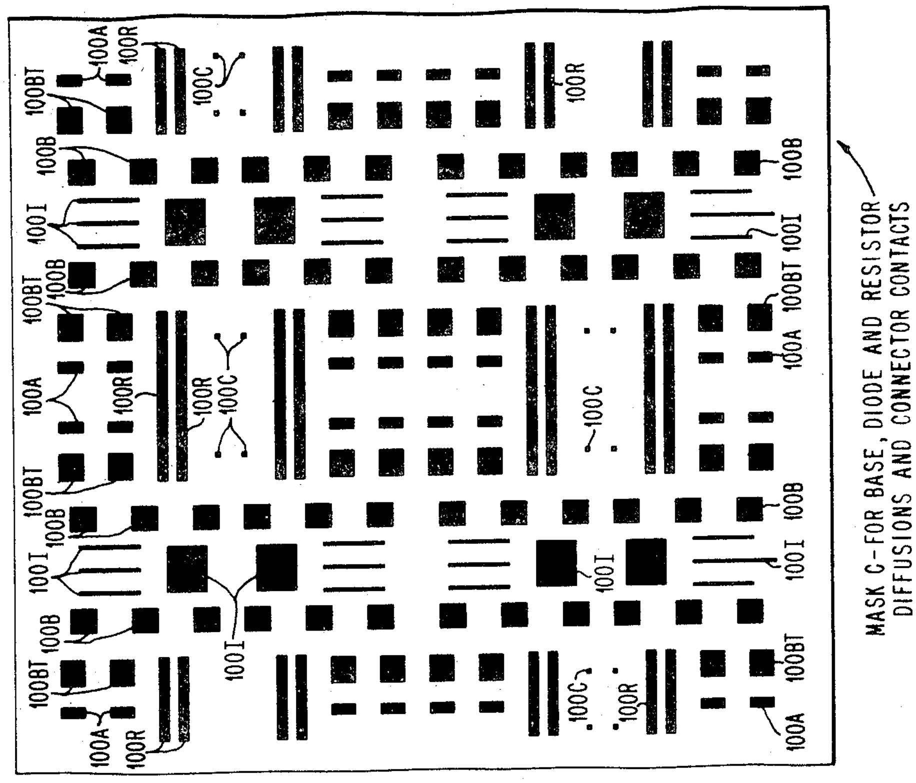

FIG. 10 depicts the mask C for base, diode and resistor diffusions and also for connector contacts. Reference numeral 100A identifies the small rectangular black boxes which represent the P type diffusion used to make the diode portion of the di-istor (diode-transistor) devices as described with reference to AFIG. 1D. Reference numeral 100B describes the square black boxes that define the base diffusion for the transistor devices as described with reference to FIG. 1T. Reference numeral 100BT describes the base regions formed in the transistor portion of the di-istor (diode-transistor) devices. Reference numerals 100R define the diffusions forming the resistor regions of the monolithic integrated structure. Reference numerals 100C define the additional diffusions which permit the formation of contacts to the underpass connectors. Reference numeral 100I depicts the isolation contact area to facilitate uniform etching of contact holes.

Figure 11:
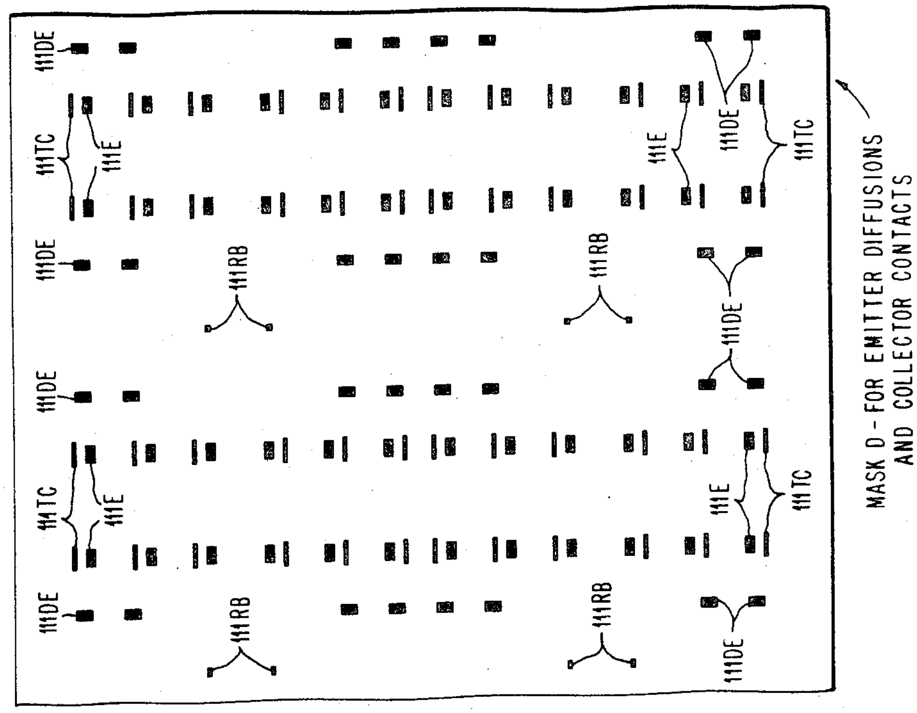

Referring to FIG. 11, reference numerals 111DE represent the emitter regions for the di-istor. Numerals 111TC represent the collector contact regions for the di-istor. Numerals 111RB represent the diffusion areas for providing enhanced electrical contact to the N type epitaxial region surrounding each connector region.

Figure 12:
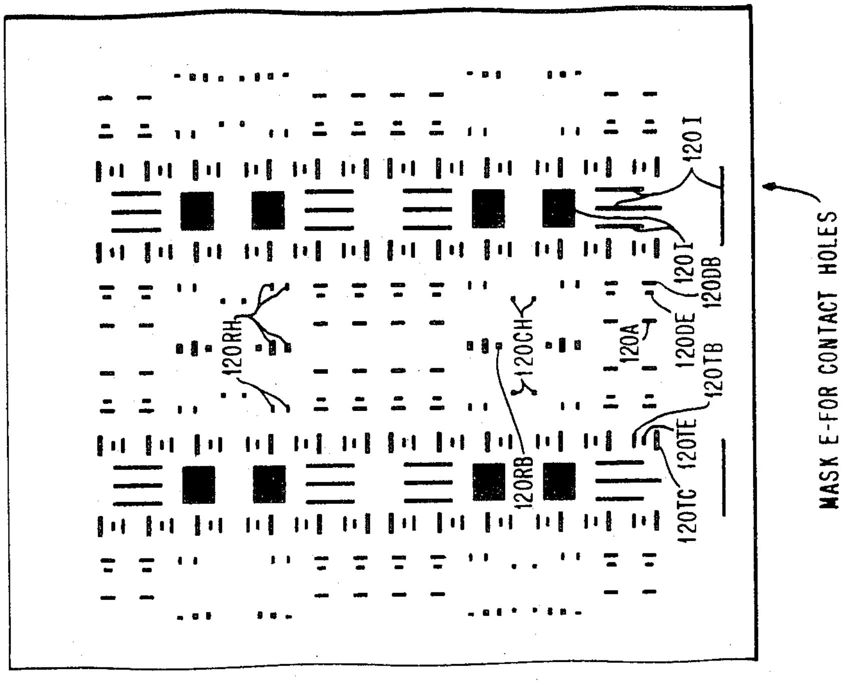

Referring to FIG. 12, mask E is used for forming the contact holes. Reference numerals 120E depict the regions on the mask which are used to form the isolation contact holes. Reference numerals 120DB depict the dark areas on the mask used to form the contact holes for the base regions of the transistor portions of the di-istor devices. Reference numerals 120DE represent the dark areas on the mask used in the formation of the contact holes for the emitter portion of the transistor of the di-istor devices. Reference numerals 120A depict the dark areas on the mask used in the formation of the contact holes for the P type regions used in forming the diode portions of the di-istor devices. Reference numerals 120TE depict the dark regions on the mask used to form the contact holes for the emitter portions of the transistor devices (with reference to FIG. 1T). Reference numerals 120TC depict the dark areas on the mask used in the formation of the contact holes to the collector portion of the transistor devices. Reference numerals 120TB depict the dark areas on the mask used in the formation of contact holes for the base portions of the transistor devices. Reference numerals 120RH depict the dark areas on the mask used in the formation of contact holes to the resistor devices. Reference numerals 120RB depict the dark areas on the mask used in the formation of contact holes to the N type epitaxial regions surrounding the connector devices so as to permit subsequent ohmic contacts to be made thereto for reverse biasing these regions. Reference numerals 120CH point out the dark areas on the mask used in the formation of contact holes for the connector devices.

Figure 13:
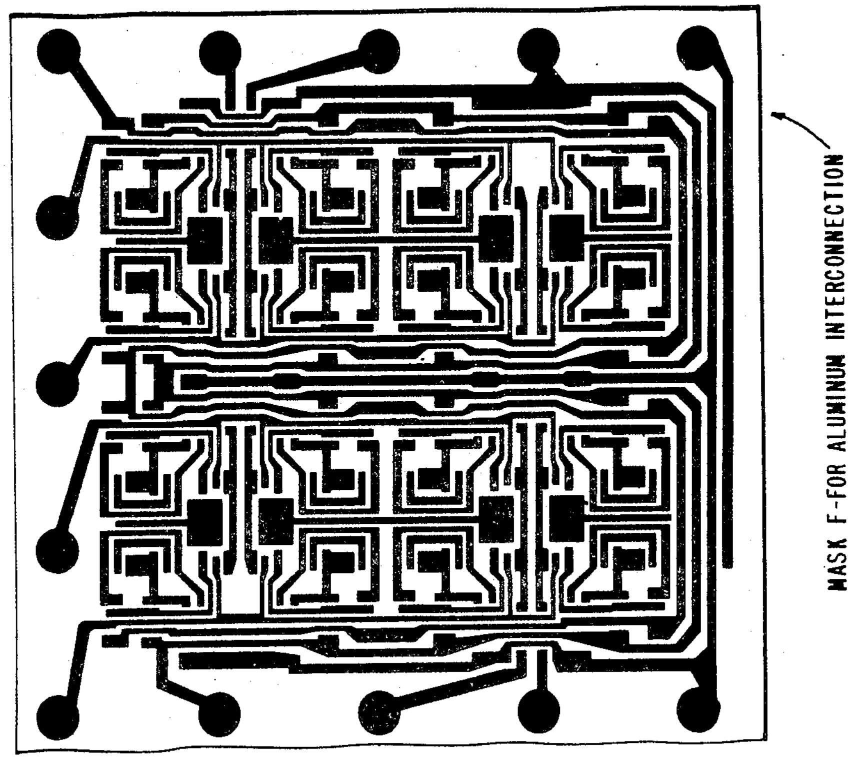

With reference to FIG. 13, mask F is shown for the aluminum interconnections. The dark areas in the mask are used to permit the formation of an aluminum land pattern corresponding to the dark portions of the mask. This aluminum land interconnection pattern serves to interconnect the various portions of the monolithic integrated structure.

Figure 14:
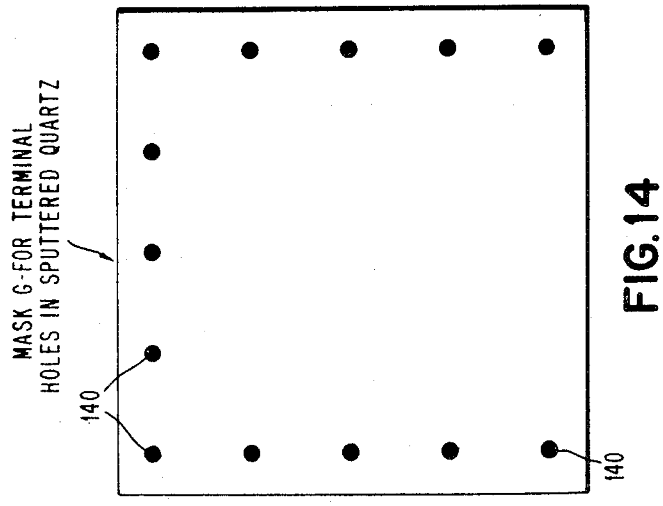

Referring to FIG. 14, a mask G is shown for the formation of terminal holes in the sputtered quartz (silicon dioxide) layer that is formed on the aluminum interconnection land pattern. Reference numerals 140 depict the dark areas on the mask which permit the formation of terminal holes to the terminal regions of the monolithic integrated structure. All the masks depicted in FIGS. 8, 9, 10, 11, 12, 13 and 14 are made of glass having the dark opaque regions thereon.

With reference to FIG. 15, a metal mask is shown to permit the formation of Cr-Cu-Au limiting lands by means of openings 150. As is evident from inspection of FIG. 15 with respect to FIG. 14, the Cr-Cu-Au limiting lands for the chip are formed over the terminal holes formed in the sputtered quartz layer.

Referring to FIG. 16, the final metal mask is shown for forming the monolithic integrated structure. The mask of FIG. 16 is for permitting the formation of Pb-Sn pads. Reference numerals 160 depict the holes in the mask which permit the formation of the Pb-Sn pads over the Cr-Cu-Au limiting lands formed on the chip. As is noted from inspection of FIG. 16 with reference to FIG. 15, the holes 160 of FIG. 16 are much larger in diameter than the holes 150 in FIG. 15 which is necessary for the lead-tin pad reflow operation described in the section entitled "Fabrication Method."

With reference to the mask overlay view of FIG. 17, partial views depict a corner portion of each mask shown in full in FIGS. 8, 9, 10, 11, 12, 13, 14, 15, and 16. FIG. 17 shows how portions of the masks are aligned with respect to each other to provide an understanding of the manner in which the monolithic integrated structure is formed. FIG. 17A shows in phantom lines that the portions of the masks shown in FIG. 17 are only portions of the full masks that are used in the formation of the monolithic integrated structure. Each of the individual masks shown in FIG. 17A are respectively shown in FIGS. 8, 9, 10, 11, 12, 13, 14, 15, and 16.

A 0.2 mil tolerance for all diffusion masks and a 0.3 mil aluminum land width and separation were used in order to insure a good yield.

MEMORY CELL OPERATION

Figure 6:
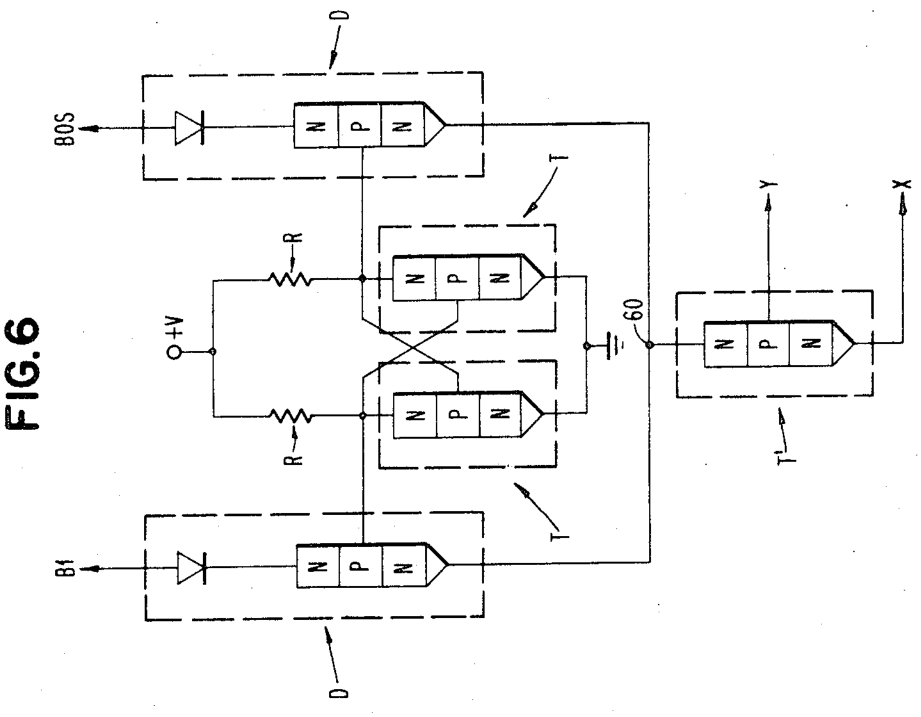
FIG. 6 is an electrical schematic view of a single three dimensional memory cell shown in integrated form in the electrical schematic view of FIG. 3.

Referring to FIG. 6, a schematic view is shown of the individual memory cell of the monolithic integrated structure. The memory cell consists of two transistors T and two 1,000 ohm resistors R connected as a direct coupled trigger which provides the storage function; two transistors and two diodes D (each defined above as a di-istor) that function as a current switch which provides the interrogation (read-write) functions, and a common mode transistor T′ which furnishes the X—Y array selection capability for a three dimensional memory cell operation. In the 2 dimensional cell operation of FIG. 6A, the common mode transistor T′ is eliminated and replaced by a resistor R′.

The read operation of a particular bit is performed by the coincident excitation of the X—Y lines which causes approximately a 3ma representative current to flow through the diode which is electrically connected to the collector of the current switch di-istor D that has the highest base potential. Since the sensing is obtained from the diode bit line, called the BOS line, the presence of a current indicates a "one" state and conversely the absence of a current indicates a "zero" state. The circuit is designed to prevent the current switch di-istor D and the current source transistor T′ from saturating, thus resulting in a high speed nondestructive read operation. A minimum coincident drive pulse width of 8 nanoseconds is generally required to insure complete reading of every storage cell in the 4 × 4 memory array, 2 × 8 memory array, the 8 × 8 memory array, etc.

The write operation is carried out by the multicoincidence of the X—Y line excitation and a decrease of the respective bit (zero or one) line to a level of 0.5 volts. These conditions force the respective current switch di-istor D into saturation and if the cell is in the complementary state, the following occurs. The saturated base current of approximately 2ma is initially supplied by the base majority carriers stored in the saturated latch or trigger transistor T and ultimately through the one kilohm resistor R which initiates the regeneration cycle that inverts the conduction state of the d. c. trigger. During the write cycle, the common emitter mode 60 has a potential of approximately 0.2 volts below ground (negative potential). This permits the P type isolation region in the monolithic cell to be tied to ground with negligible leakage current. A minimum coincident drive pulse width of approximately 15 nanoseconds is required to insure reliable writing into each cell of the monolithic integrated chip.

The diode load in the sense lines forming part of the di-istor D provides a constant voltage drop insensitive to read current, thus assuring a non-saturating condition of the current switch sensing transistor portion of the di-istor during the read operation over a wide operating current range. However, the diode load in the sense line which forms part of the di-istor D permits a voltage drop of sufficient magnitude to cause the selected sense transistor portion of the di-istor D to saturate during the write cycle. In addition, the diode load minimizes capacitance loading on the common sense lines of other cells when connected into an integrated array by its low series capacitance action. Furthermore, the diode load also prevents erroneous writing in non-selected cells for low sense voltage levels thereby serving as a D. C. isolator of non-selected memory cells. A memory circuit similar to the above described memory cell is disclosed in a U.S. Pat. application identified as Ser. No. 449,093 filed Apr. 19, 1965, in the names of Farber and Schlig and assigned to the same assignee of this invention.

In the 2 dimensional memory cell circuit shown in FIG. 6A, the transistor T′ of FIG. 6 is replaced by the resistor R′. The resistor R′ serves as a current source feed upon the actuation of the word line. The remaining portion of the circuit functions in the same manner as described above with respect to FIG. 6. As is evident from FIG. 6A, the two dimensional memory cell circuit has only one select line (work line) whereas the three dimensional memory cell circuit of FIG. 6 has two select lines (X and Y).

The individual 10 × 10 mil monolithic memory cell design of the 4 × 4 memory cell matrix array consists of 16 interconnected memory cells as described above. The N type epitaxially grown region isolating the resistors and connectors is tied to the most positive voltage (1.8V) to minimize parasitic junction capacitance and to insure a reverse biased condition for the boron diffused resistors. Isolation between devices is obtained by connecting the P isolation regions to ground which is the most negative available d. c. potential.

The underpass connector described with reference to FIG. 1C permits a single encapsulation layer of quartz to be used since the underpass connector pemits crossing the Y conductive line with other conductive lines. In order to eliminate the need for another underpass connector and thus save silicon area, the P type isolation region is used to provide the connection of the ground bias to the common emitter of the d. c. trigger. This adds approximately 1 ohm common resistance.

DEVICE ELECTRICAL CHARACTERISTICS

The diodes of the di-istor have a $V_f = 0.95$ volts at 3ma. The storage recovery time with an $I_f$ equal to 3ma and an $I_r$ equal to 0.3ma is 2 nanoseconds. The junction capacitance is 0.2 picofarad at zero volts.

The transistor electrical characteristics are as follows: $f_t$ = 250 megacycles minimum at 1.0ma which peaks to 290 megacycles at 3ma;
collector resistance ($R_c$) = 30 ohms;
base resistance ($I_e$ = 1ma, $\beta$ saturation = 1) = 80 ohms;
collector-isolation capacitance at −1.0 volts = 1.2pf;
collector-base capacitance at zero volts = 0.7 pf;
emitter-base capacitance at zero volts = 0.5pf;
$BV_{ebo} > 5.0$ volts;
$BV_{cbo} > 15$ volts;

$BV_{ceo}$ at 3 ma > 6.0 volts;
$BV_{ci}$ (collector to isolation breakdown) > 20 volts;
$V_{be}$ ($I_e$=3ma; $c$–$b$ shorted)=0.82 volts;
$\beta$ ($I_e$=1 to 3ma; $c$–$b$ shorted) > 20 volts;
$V_{ce}$ ($I_c$=1ma; $I_b$=0.3ma)=0.11 volts;
$V_{be}$ (under saturation) ($I_c$ = 1ma; $I_b$ = 0.3 ma) = 0.81 volts;
$V_{ce}$ ($I_c$=0; $I_b$=2ma)=44 mv;
$I_{cex}$ ($V_{be}$=0.5v, $V_{cb}$=+1.0v) < 100 nonoamperes; and
$\beta$ inverse is approximately 0.4

Each of the 1,000 ohm resistors have a capacitance of 1.0 picofarads at 0 volts. The positive temperature coefficient is 800 parts per million per degree centigrade.

The long and short underpass connectors have a total resistance of 18 and 45 ohms respectively and a capacitance of 2.5 and 6.2pf at 2 volts reverse bias, respectively.

Figure 2:
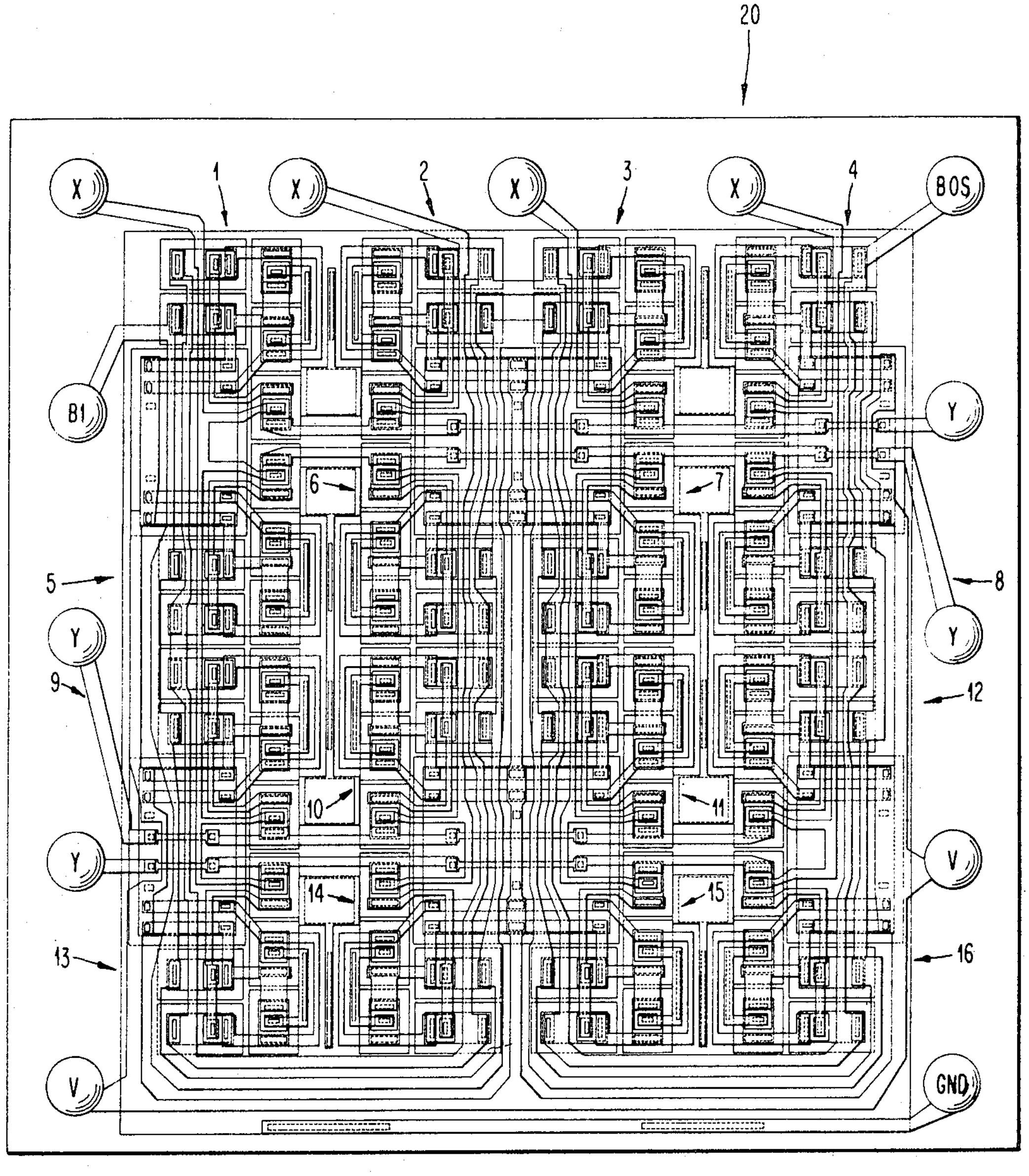
FIG. 2 is a planar view of a 4 × 4 monolithic memory chip having 16 memory cells.

Referring to FIG. 2, a planar view is shown of the 4 × 4 monolithic memory cell array 20 after the fabrication process has been completed and the sputtered quartz has been applied to the surface of the aluminum land pattern. Thirteen contact pads are provided along the outer perimeter of the monolithic chip 20. As describd with reference to FIG. 6 which is a schematic representation of one memory cell, X lines 4 and Y lines 4 are provided for connection to the 16 emitter regions and the 16 base regions of the current source transistor T'. As indicated by this figure and also by enlarged figures 2U and 2L which are blown up sections of the upper and lower portions of FIG. 2, each X line is connected to 4 emitter regions and each Y line is connected to 4 base regions of the current source transistor T'. In this manner, read and write operations can be performed by simultaneously applying signals to selected X and Y lines. B1 terminal contact is the bit 1 sense line which is connected to the di-istor portions of all 16 memory cells as shown in FIG. 6 which are generally identified by reference numerals 1–16 indicated in the figure. BOS terminal is the bit 0 sense line which is connected to the di-istors of the 16 memory cells. Ground terminal GND is connected to the common emitter of the direct coupled trigger or latch circuit consisting of the two transistors T and the two resistors R as shown in FIG. 6. Terminals +V are connected to the two resistors R of each memory cell of the 16 memory cell array and serve to supply power for latching.

Figure 2A:
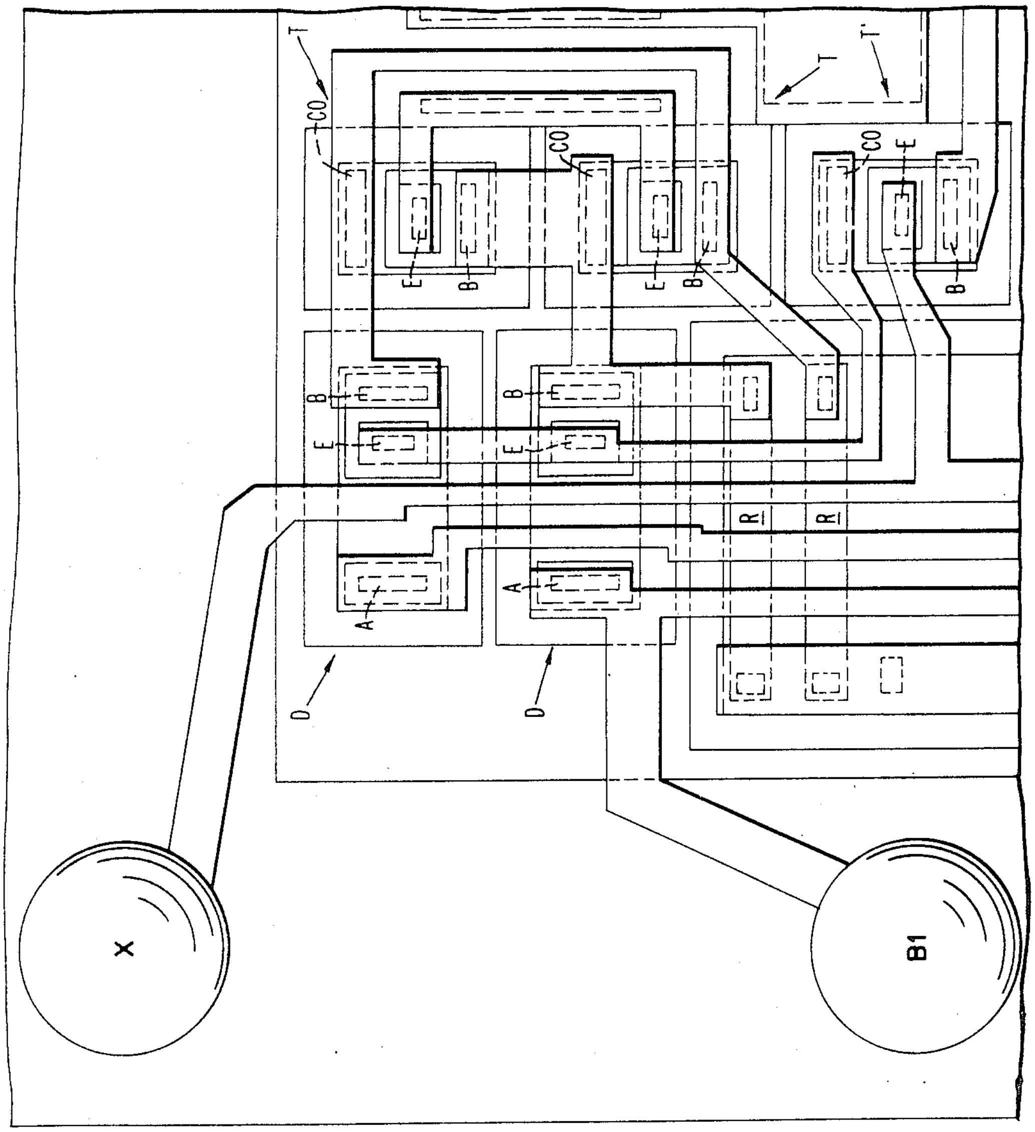
FIG. 2A is an enlarged fragmentary view of one memory cell of the 4 × 4 chip shown in FIG. 2.
Figure 2L:
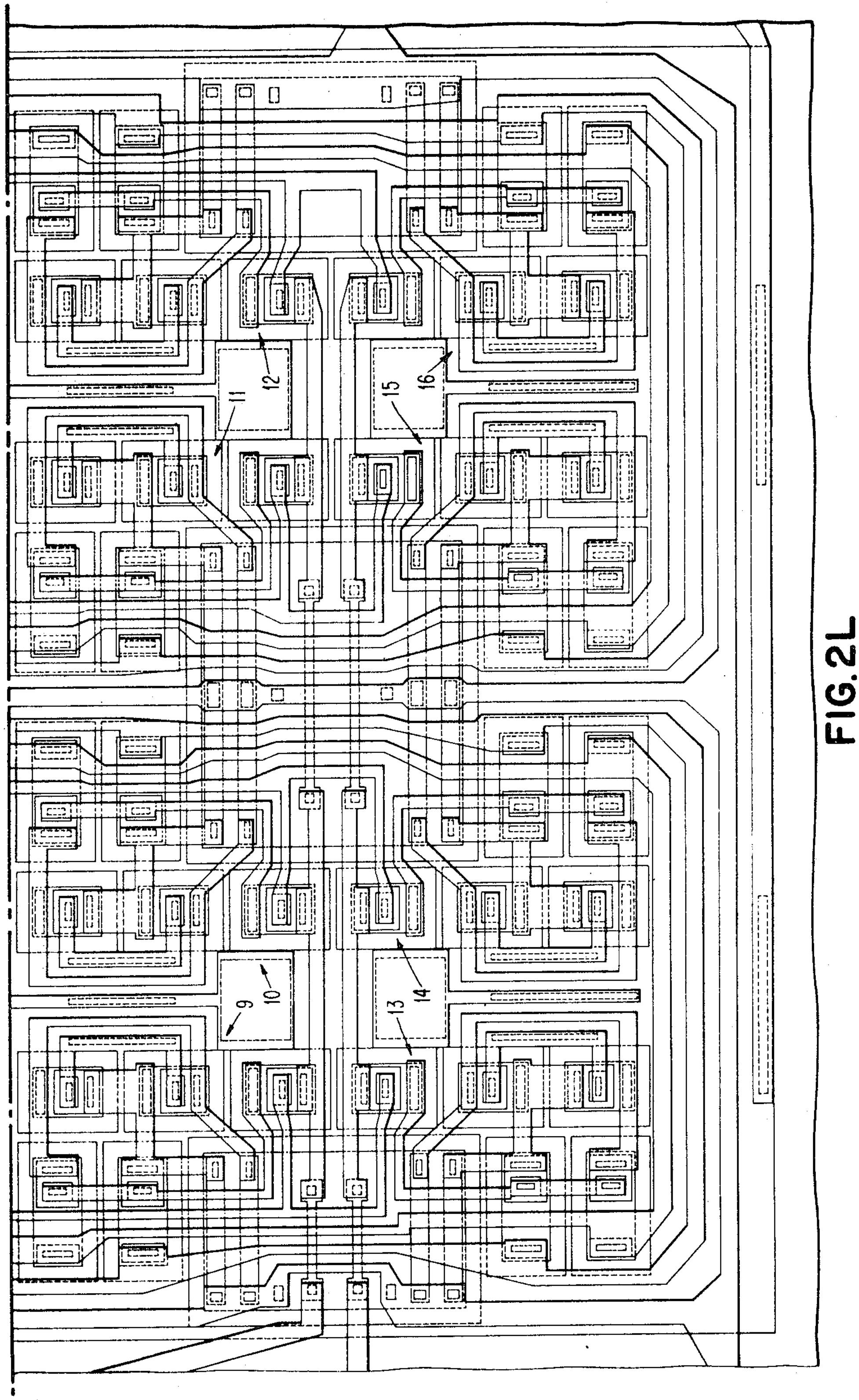
FIG. 2L is an enlarged planar view of the lower portion of the 4 × 4 memory chip of FIG. 2.
Figure 2U:
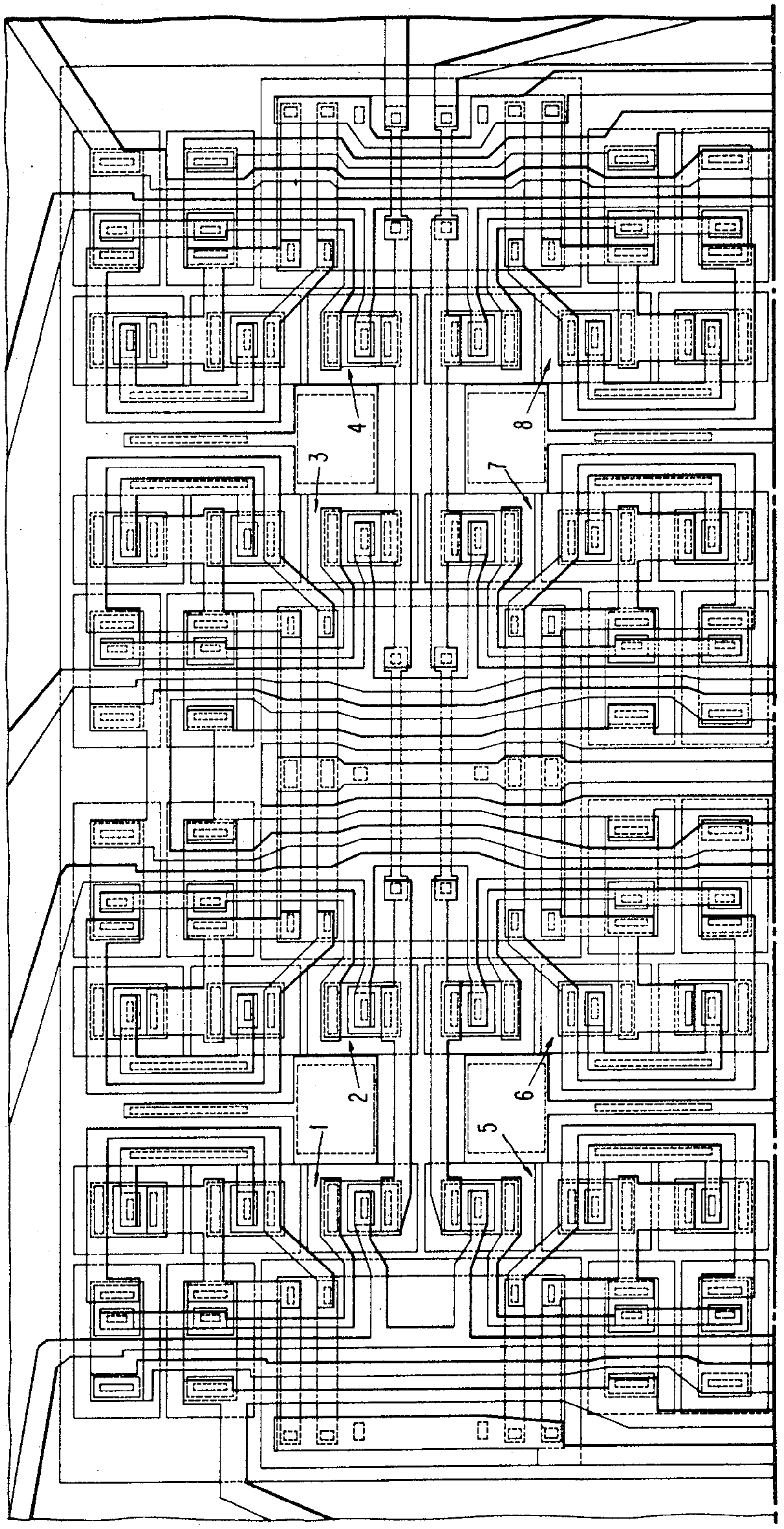
FIG. 2U is an enlarged planar view of the upper of the 4 × 4 memory chip of FIG. 2.

Referring to FIGS. 2U and 2L, the individual components for each memory cell are designated by reference numerals D (di-istor or diode-transistor), R (resistor), T (transistor), T' (current source transistor), C (under pass connector) and U (underpass formed by isolation region).

Referring to FIG. 2A, a blown up view of memory cell 1 of the planar view of FIG. 2 is shown. In this figure, the di-istor (diode-transistor), resistor, transistor, and isolation underpass are identified by reference letters D, R, T or T' and U. Within each box identifying the di-istors, resistors, transistors, the various semiconductive regions as identified by reference letters E, B, CO, and A respectively represent the emitter diffusion forming the emitter regions, the base diffusion forming the base regions, the colle tor regions and the base type diffusion forming the P type regions for the diode portion of the di-istor.

Figures 4, 5:
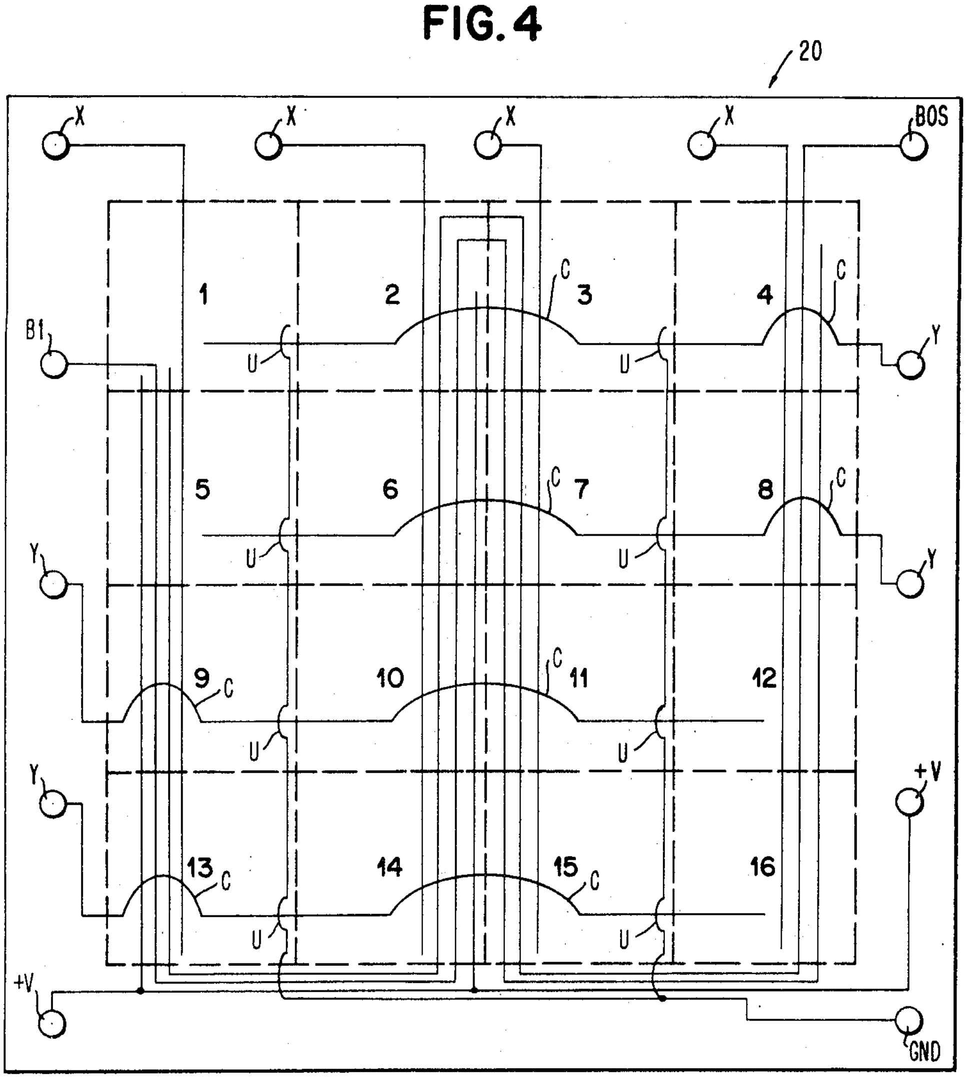
FIG. 4 is a diagrammatic view of the manner in which the 4 × 4 memory array is laid out indicating each of the 16 cells and the way they are interconnected.
FIG. 5 is a table showing the mirror image relationship between each of the cells as shown in the planar view of FIG. 2.

Referring to FIGS. 4 and 5, the 16 memory cell chip 20 is shown in FIG. 4 as a diagramatic layout. The interconnection of the devices with the lines from the outside terminal are clearly shown by this diagramatic representation. Eight underpass connectors regions are depicted by the curve lines C shown in this figure. Eight isolation type underpasses are shown by the curve lines identified as U. In this manner, the monolithic integrated structure is fabricated without the necessity of plural metallization layers.

Referring to FIG. 5, the individual memory cells are shown as they are represented in the planar view of FIG. 2. As can be seen from this table, using memory cells 1, 3, 9, and 11 as the object cells, there is a mirror image effect for the vertical plane, the horizontal plane and also with respect to the diagonal. It is this mirror image pattern which permits the monolithic integrated structure to be fabricated saving valuable semiconductor area. This mirror image pattern also permits smaller interconnection paths which increases circuit speeds and in addition, facilitates the wiring or interconnection between the cells.

Figure 7A:
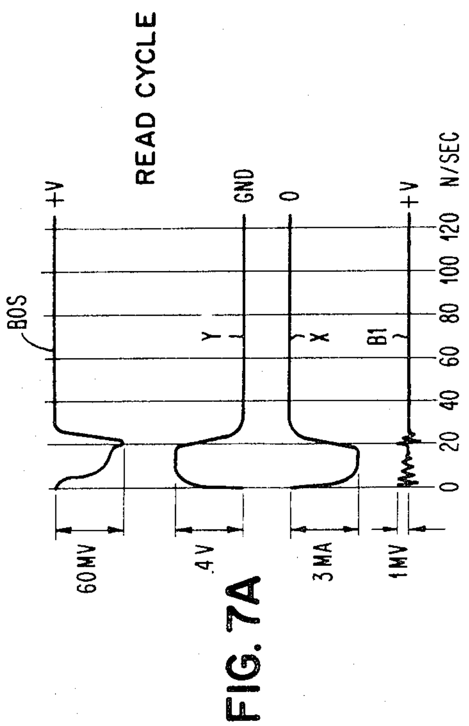
FIG. 7A is a graph showing the electrical characteristics achieved during a read operation.
Figure 7B:
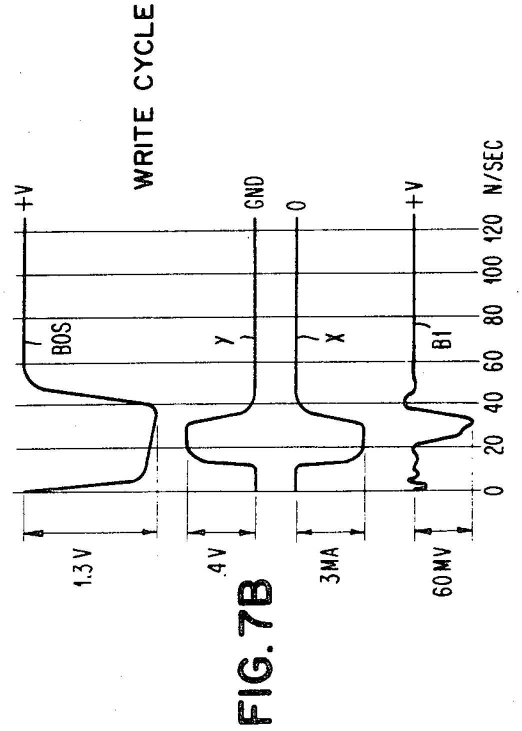
FIG. 7B is a graph showing the electrical characteristics achieved during a write operation.

Referring to FIGS. 7A and 7B, the waveform responses for the read and write cycles of the memory cell of this invention are shown.

Referring to FIG. 7A, the curve identified as BOS is the bit 0 sense output during a read 1 cycle. The waveform shows an amplitude of 60mv and a time period of 20 nanoseconds. This waveform shows that it takes approximately 8 nanoseconds for the circuit to achieve an output substantially close to its maximum value. The bit 1 output B1 shown by the waveform at the bottom of FIG. 7A is the output of the B1 line during the read cycle and indicates that the noise signal shown between the 0 to 20 nanosecond time range is minimal. Waveform curves Y and X in FIG. 7A respectively show the Y and X input signals. As is apparent from these curves, the X and Y input signals are coincident.

Referring to FIG. 7B, the BOS line represents the bit "0" sense line signal during a write 0 cycle. As can be seen from this waveform, the amplitude voltage is 1.3 volts. The B1 waveform which is the bit 1 line output during the write 0 cycle indicates when considered with the X and Y coincident input waveforms that a 15 nanosecond time period is required to write a 0 into the memory cell. It is evident that this would be the same time period required to write a 1 into the memory cell.

Figure 3:
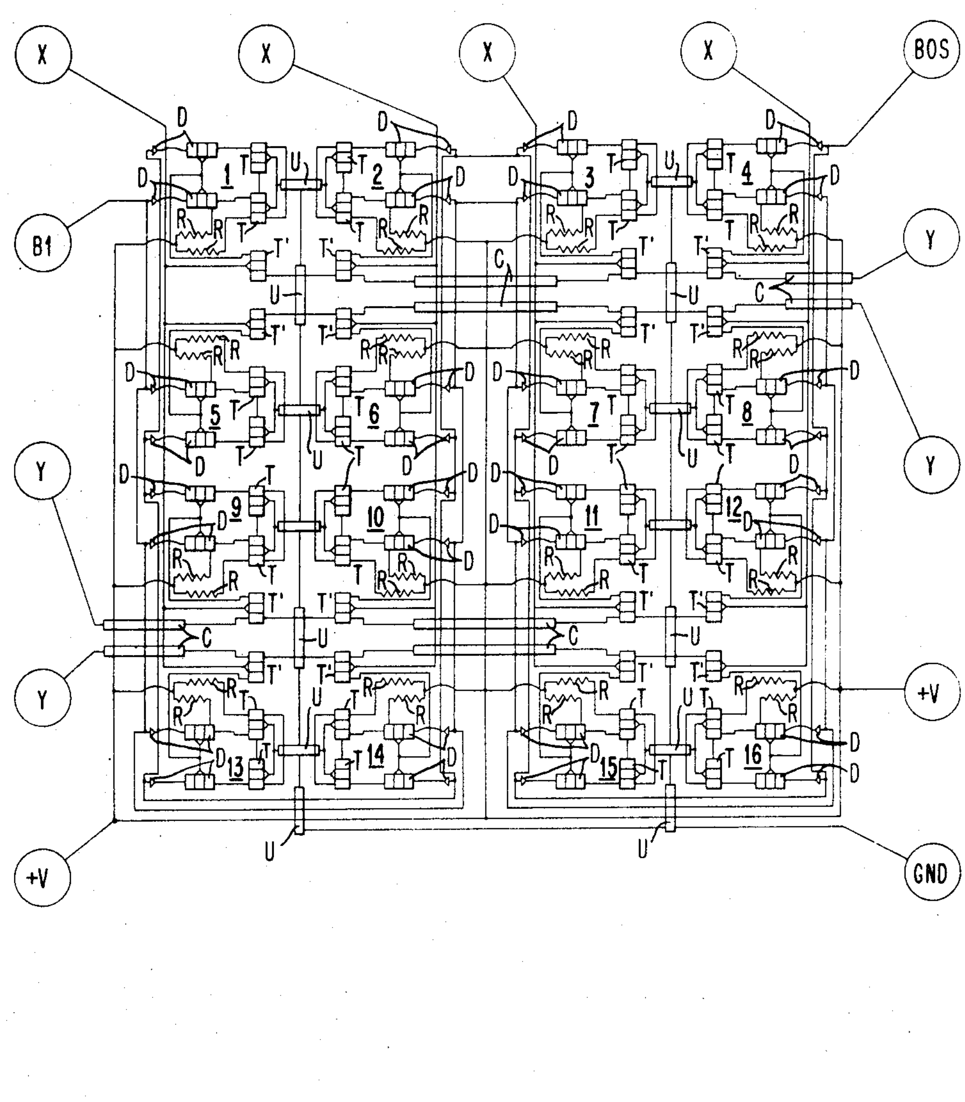
FIG. 3 is an electrical schematic view of the 4 × 4 monolithic memory chip shown in FIG. 2.

Referring to FIG. 3, an electrical schematic view is shown of the 4 × 4 memory cell array of FIG. 2. Each of the individual devices are depicted by the reference letters used previously with reference to FIGS. 2A, 2U and 2L. The 16 individual memory cells are identified by reference numerals 1–16.

Figure 19:
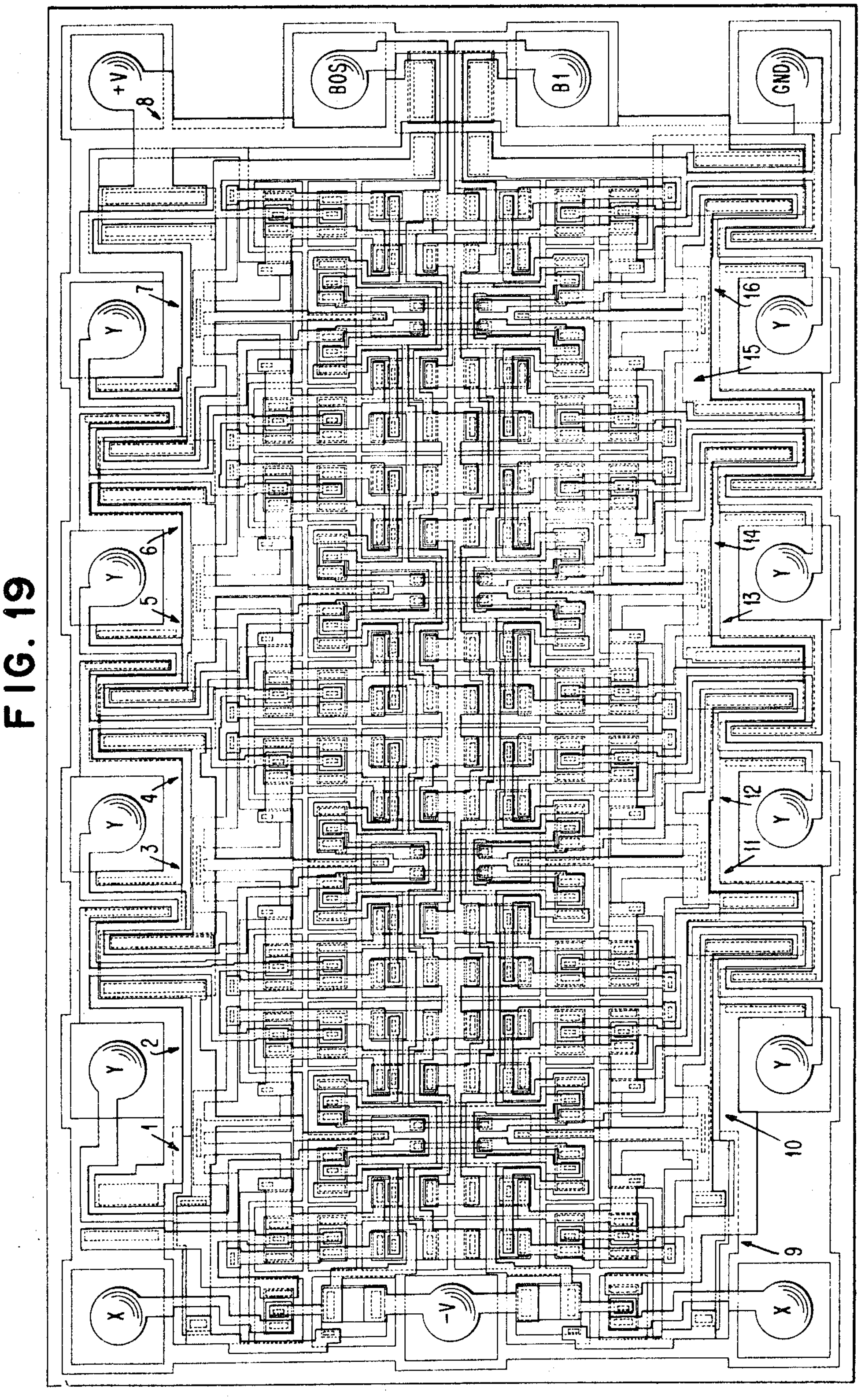
FIG. 19 is a planar view of a 2 × 8 monolithic memory chip made in accordance with the fabrication process of this invention.
Figure 20:
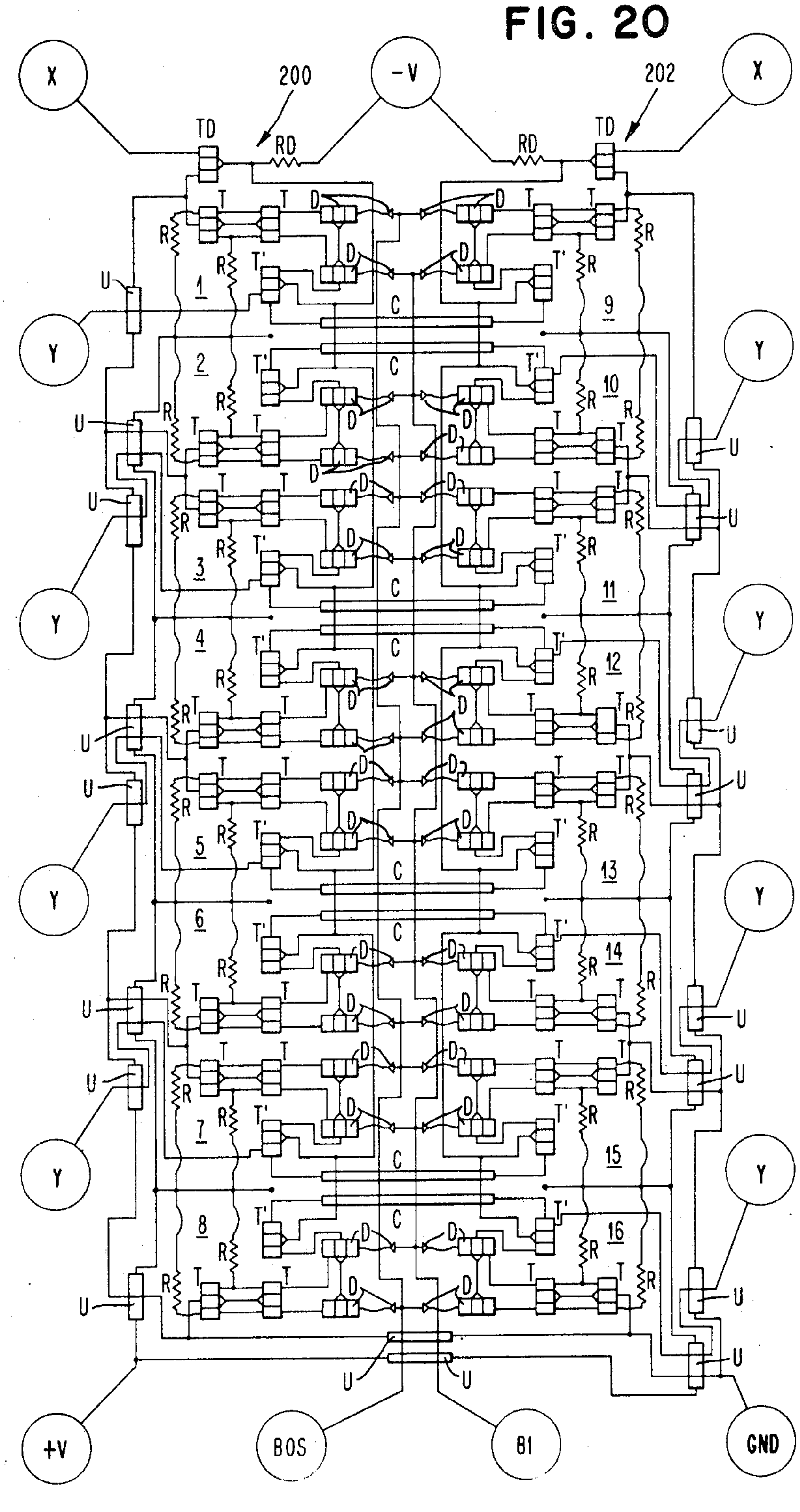
FIG. 20 is an electrical schematic view of the monolithic integrated structure of FIG. 19.

Referring to FIG. 19, a planar view is shown of a 2 × 8 memory array as viewed looking downwardly through a sputtered encapsulation layer located on the metallized pattern. As shown in FIG. 2, the dotted phantom lines represent the diffused regions beneath the aluminum land patterns and where there are no aluminum lands blocking the diffused regions, then the diffused regions are shown in solid lines. There are 15 terminals which consist of eight Y input lines with each Y line connected to two base regions of the current source transistor T'. There are only two X input lines each of which are connected to the eight emitter regions of the current source transistor T' via separate power drivers that consists of transistor TD and resistor RD which is connected to the negative voltage supply terminal (¯V). This power driver circuit, when excited by a voltage on the X line, will supply the required current level to the emitter of the current source transistor of the selected memory cell. The circuit configuration of this driver is shown in FIG. 20 and identified by reference numerals 200 and 202. The rest of the terminals for this memory array correspond to the similar terminals used in the 4 × 4 memory array of FIG. 2. Hence, the operation of the 2 × 8 memory cell is substantially the same as the operation of the 4 × 4 memory cell.

Figure 19L:
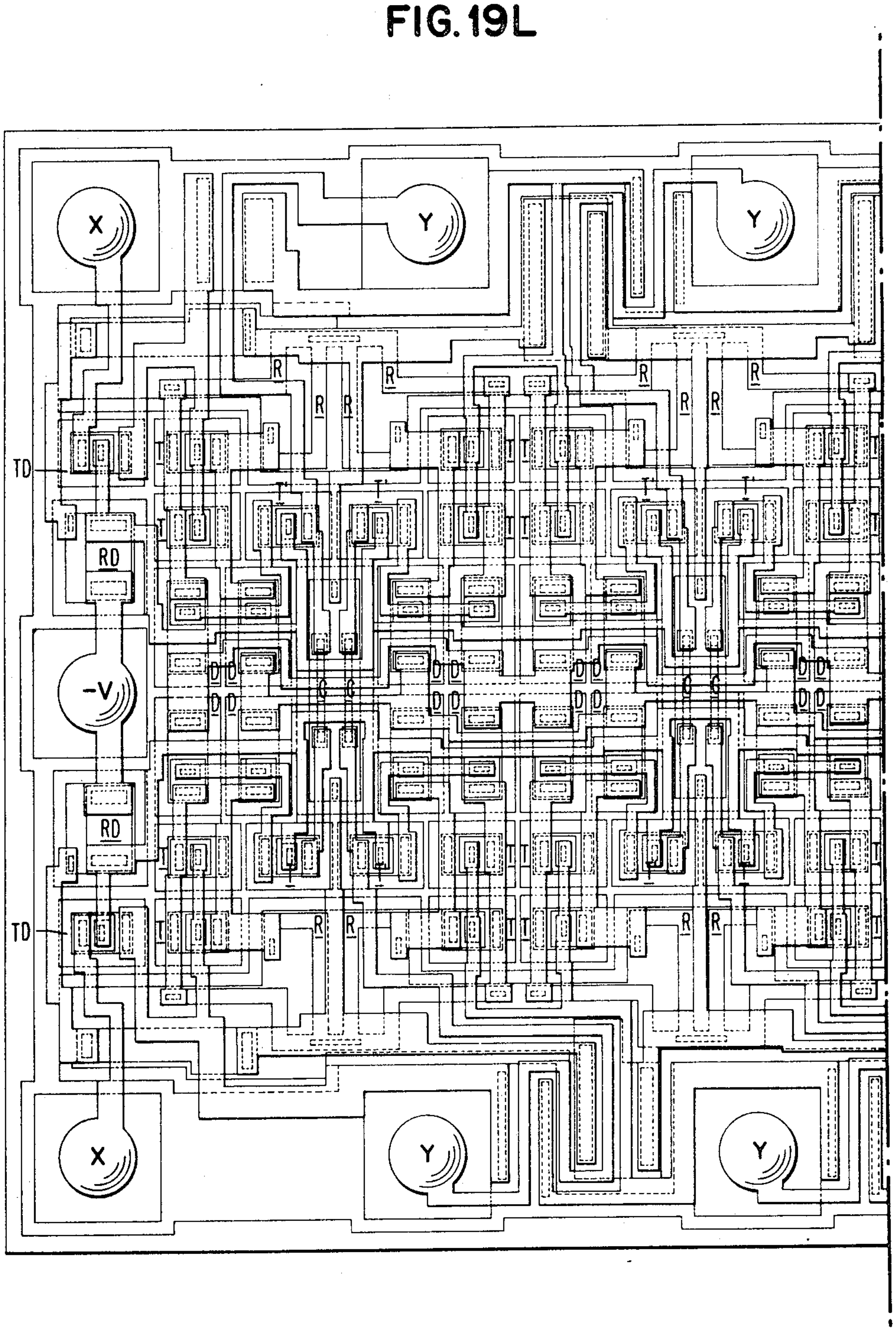
FIG. 19L is an enlarged planar view of the left-hand portion of the monolithic memory chip of FIG. 19.
Figure 19R:
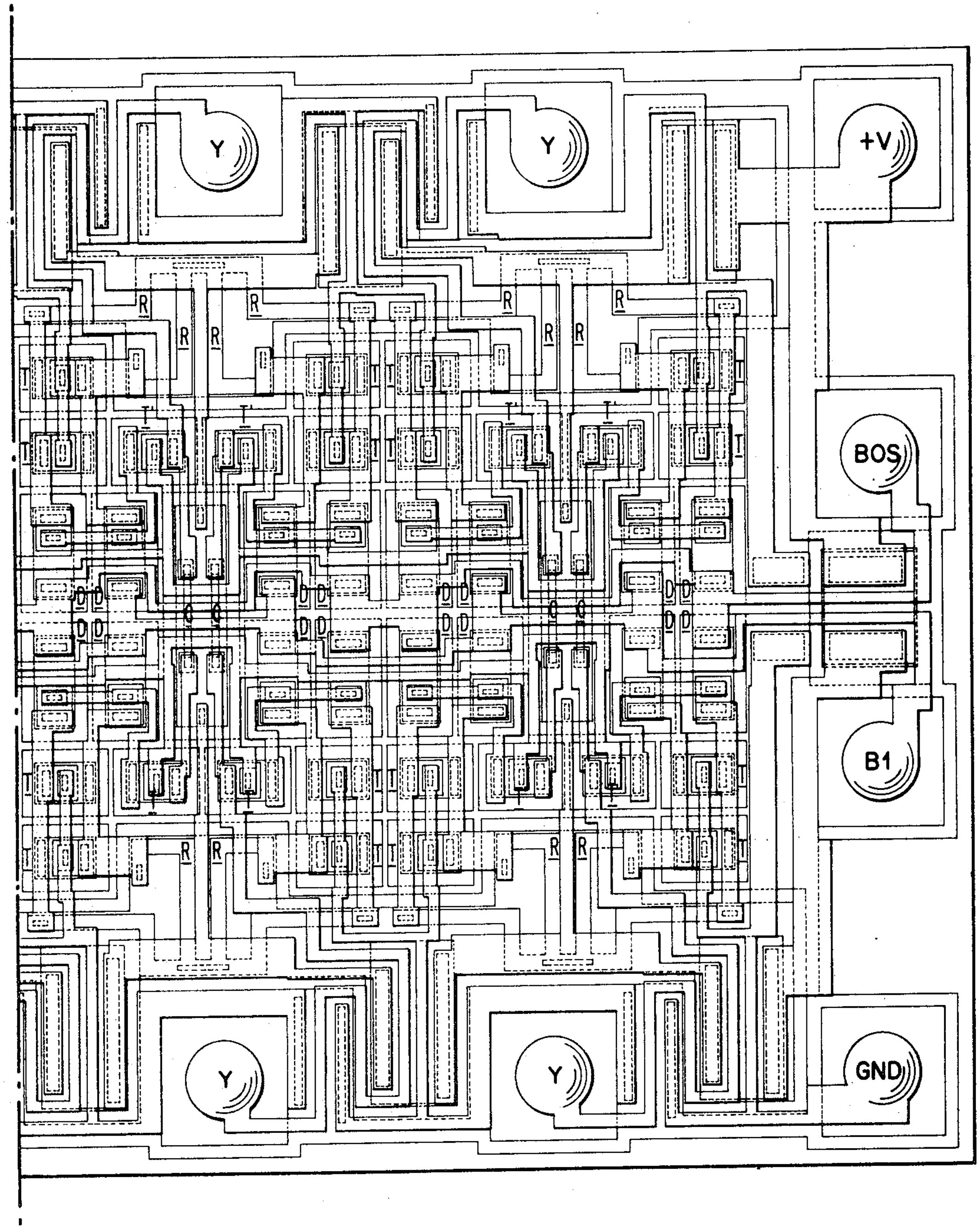
FIG. 19R is an enlarged planar view of the right-hand portion of the monolithic memory chip of FIG. 19.

FIGS. 19L and 19R represent enlarged views of the left and right side portions of FIG. 19. The individual components of the 2 × 8 memory array of FIG. 19 are identified in FIGS. 19L and 19R as was done previously with respect to FIGS. 2U and 2L.

FIG. 20 depicts in detail the electrical schematic representation of the 2 × 8 memory array shown in FIG. 19 or FIGS. 19L and 19R. The various components shown in FIGS. 19L and 19R are also shown in FIG. 20. The embodiment depicted by FIGS. 19, 19L, 19R and 20 teach the use of a monolithic memory array having in the same integrated chip driver circuits for the array.

It is readily apparent to those skilled in the art that larger or smaller memory arrays can be formed in accordance with the teachings of this invention.

Figure 21:
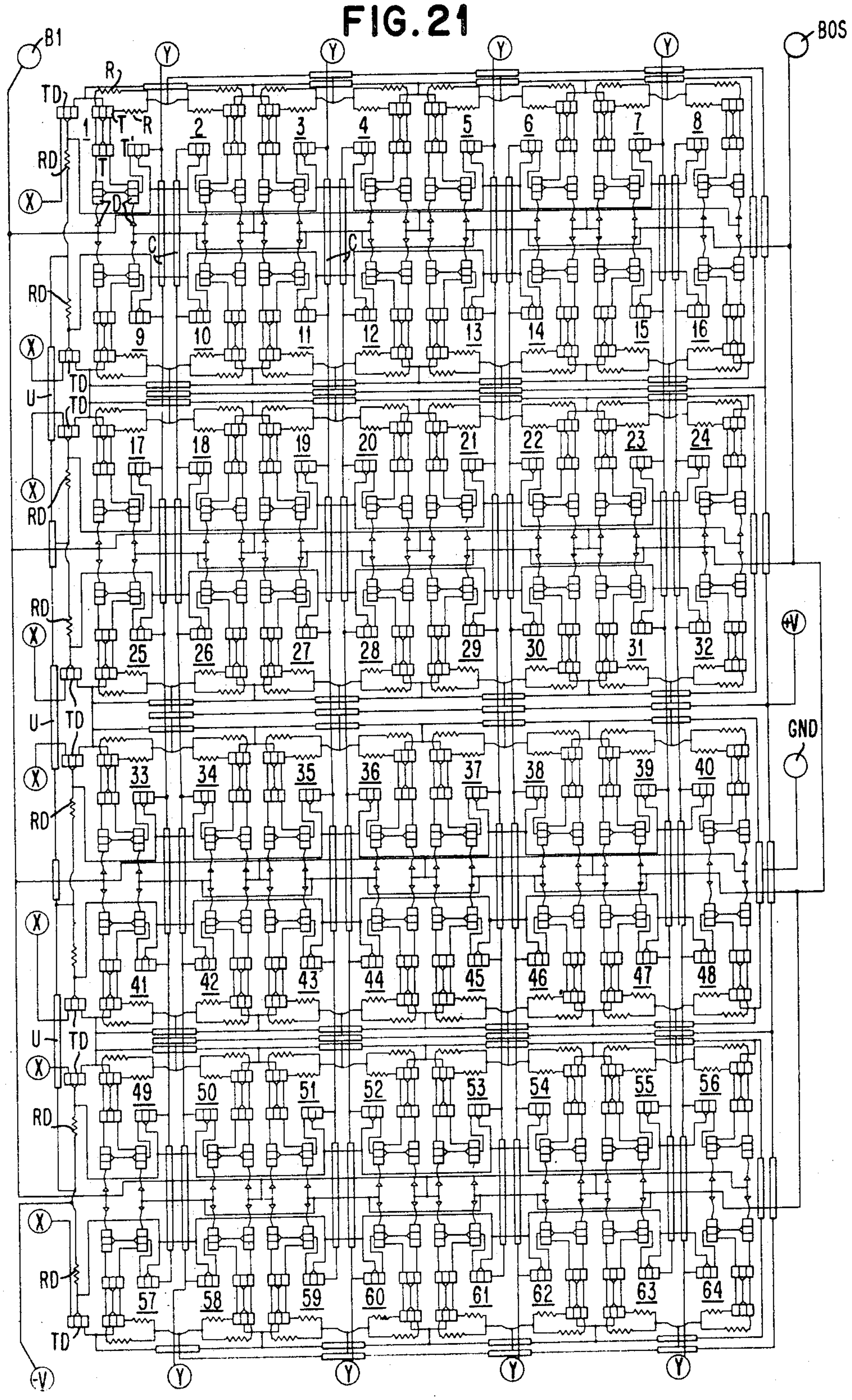
FIG. 21 is an electrical schematic view of an 8 × 8 monolithic integrated structure made in accordance with the fabrication process of this invention.

FIG. 21 illustrates a schematic representation of a 8 × 8 or 64 memory cell array. Each of the 64 memory cells is identified by reference numerals 1–64, and the individual components for one of the memory cells is identified in memory cell 1 by the same reference characteristics applied previously to the other figures. In this configuration there is a total of eight driver circuits for each of the X lines. The remaining terminals serve the same function as described previously.

WRITE - READ OPERATION FOR THREE DIMENSIONAL MEMORY ARRAY

In writing, for example a 0 into the memory cell 16 of FIG. 3, current is applied to the external X terminal located adjacent the BOS terminal, a voltage is applied to the Y terminal on the left side of the drawing located adjacent the +V terminal, and a voltage is also applied to the BOS line. All of these signals are applied simultaneously as described previously with regard to the "-Memory Cell" section. The memory cell 16 is read out by the output from the BOS external terminal which is connected to the lowermost di-istor D shown in the memory cell 16. This is done by simultaneous X-Y selection as previously described above with reference to the "Memory Cell" section.

Similarly, with reference to the 2 × 8 schematic array shown in FIG. 20, memory cell 16 in this memory array is read into by applying current to the external X terminal located at the top right side portion of the figure. The current applied to the X terminal is applied to the base of the driver transistor TD which causes this transistor to turn on and drive the current source transistor T' of memory cell 16. A voltage is simultaneously applied to the Y terminal located adjacent the ground terminal and also to the BOS terminal. Reading of the memory cell 16 of FIG. 20 appears as the output signal on the BOS line which is connected to the upper di-istor shown in the memory cell 16 of FIG. 20. This occurs after proper X–Y selection as described above.

In writing into memory cell 16 of FIG. 21, current is fed to the X terminal associated with memory cell 16. Simultaneously voltage signals are supplied to the Y line associated with memory cell 16 and the BOS line. They Y terminal associated with memory cell 16 is located on the far right hand bottom portion of the drawing. The X terminal associated with memory cell 16 is the second X terminal down from the top on the left hand side of the drawing. The read operation can be sensed from the BOS line which is electrically connected to the di-istor located on the left side portion of the memory cell 16. This is done after proper X–Y selection as described above.

With regard to the dimensions of the chips, the 4 × 4 memory array is preferably fabricated on a 55 mil square chip. The 2 × 8 memory array chip preferably has rectangular dimensions of 51 × 75 mils. The 8 × 8 memory array chips can be accordingly fabricated in the dimensions desired.

PACKAGE

Figures 18, 18B:
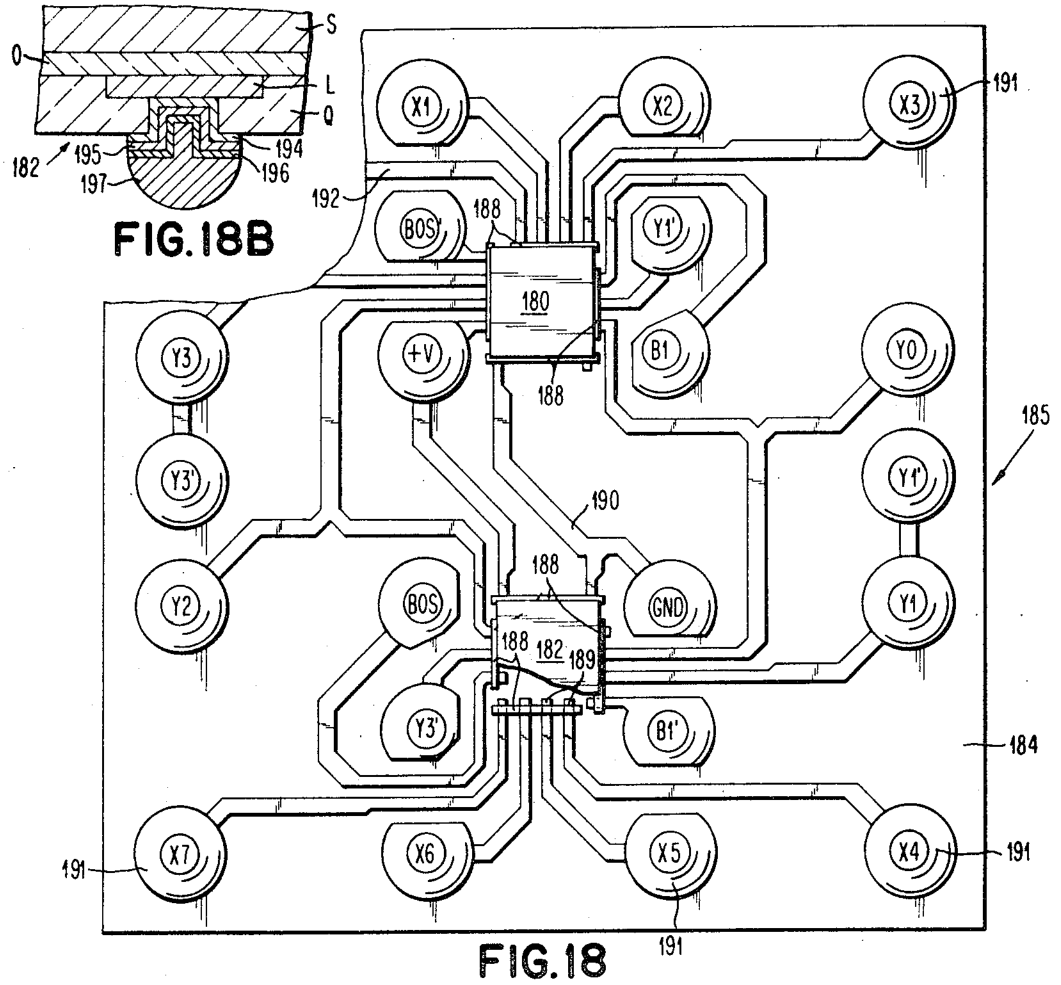
FIG. 18 is a planar view of a package containing the monolithic integrated structure mounted on printed lands located on the surface of a dielectric substrate.
FIG. 18B is a cross sectional view of one terminal contact of the monolithic integrated structure.
Figure 18A:
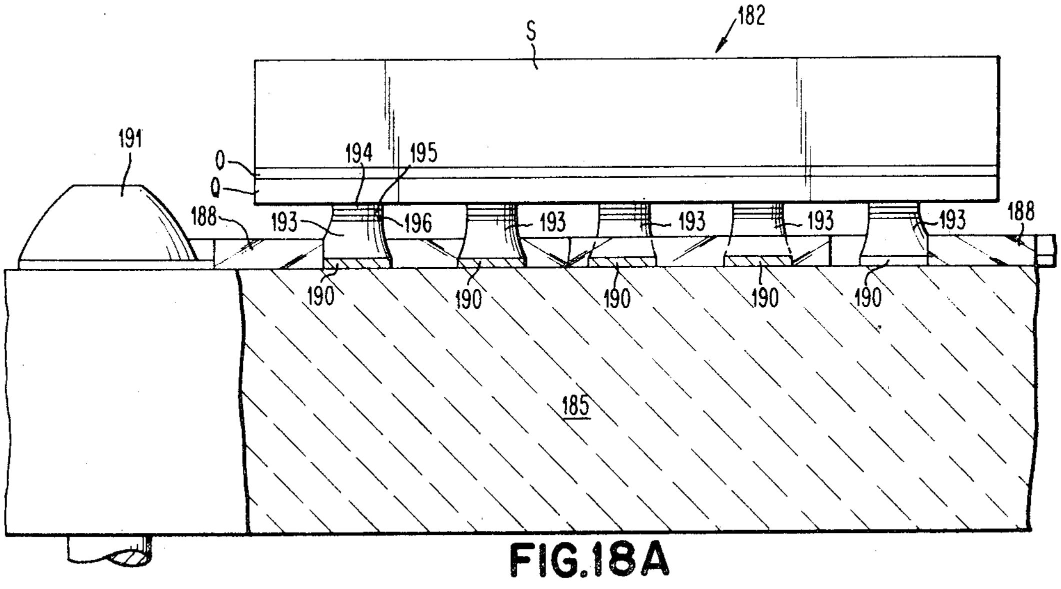
FIG. 18A is an elevational view with parts broken away to show the interconnection between the monolithic integrated structure and the conductive lands on the dielectric substrate.

With reference to packaging the monolithic integrated chips, FIGS. 18 and 18A show the manner in which the individual chips are mounted on a conductive land pattern preferably formed on a ceramic substrate.

With reference to FIG. 18, a pair of monolithic integrated chips 180 and 182 are positioned on a printed land pattern corresponding to the pad positions on the chip. The printed land pattern is located on a surface 184 of a ceramic module 185. A plurality of glass dams 188 are formed across the tips of a plurality of printed lands. The formation of the lands and glass dams are referred to in the section above which is entitled "-Fabrication Method." Fingers 189 of the lands on the ceramic surface 184 are used to provide electrical contact between the lands of the ceramic substrate and the lead-tin pads of each chip. conductive land 190 connects the ground pad terminals of chips 180 and 182 to a common external terminal identified as ground (GND) located on the surface 184 of the module 185. Most of the external terminals on the surface 184 of the ceramic module 185 are electrically connected to pins 191 which extend through the ceramic module and permit interconnection as desired, to an external printed circuit board (not shown). Similarly, all the external terminals identified by reference letters on the surface 184 of the ceramic module 185 are connected to the integrated chips 180 and 182 in the same manner as the similar symbolized external terminals of each chip are connected to the aluminum metal land patterns of the monolithic structure. Accordingly, the external ground terminal located on the ceramic surface is connected to the ground terminals of each chip and the terminals identified as B1 and B1' are electrically connected to the B1 terminals of chips 180 and 182, respectively. In this latter situation, B1' terminal does not extend through the ceramic module 185 but is electrically connected to the B1 terminal on the surface of the ceramic module by means of a conductive path (not shown)

located on the backside portion of the ceramic module. Hence, external terminal B1′ does not have a pin extending in contact therewith. Similarly, terminals BOS and BOS′ are interconnected to chips 182 and 180, respectively, in the same manner as described with respect to B1 and B1′. In both cases, the terminal with the prime number designates that there is no pin connected to this terminal. In the package arrangement shown in FIGS. 18 and 18A, 4 × 4 memory chips are used for the chips 180 and 182. The interconnection that is formed on the ceramic substrate between chip terminals and substrate terminals results in a three dimensional memory array consisting of 8 X and 4 Y selection terminals. The $X_o$ terminal (not shown because of break away) is connected to the integrated chip 180 by means of conductive land 192. The module has a total of 16 terminal regions which are connected to 16 pins and the six terminals identified with a prime number are not connected to pins but are interconnected to terminsl of the same symbolic designation but without the prime.

Referring to FIG. 18A, the monolithic integrated chip 182 is shown located on the ceramic module 185. Portion 193 depict the electrical contact regions formed by the unification of the lead-tin pads of the chip with the lead-tin coating formed on the fingers 189 of the land portion formed on the ceramic surface 184. As is clearly shown from this figure, the chip 182 is provided with a positive standoff so as to support it spaced from the surface of the glass dams 188.

FIG. 18B is a detailed sectional view showing one of the chip terminal connections prior to connection to one of the fingers 189. Reference letter S (FIGS. 18A and 18B) depicts the silicon material of the monolithic integrated chip 182. Reference letter O depicts the thermal oxide coating on the silicon surface. Reference letter L depicts the aluminum land pattern formed over the oxide layer o. Reference letter Q depicts the sputtered quartz layer formed on the oxide layer O and also on the aluminum lands L. the terminal contact is provided by chrome layer 194, copper layer 195, and gold layer 196. Lead pad 197 completes the terminal assembly for the integrated chip 182.

What has been described is an integrated memory structure containing an interrelated plurality of design and process considerations which, in combination, permit the realization of all of the design features set forth in the earlier portion of this description and which admit of individual improvements in device fabrication and performance. The above described technique permits of the incorporation of the ultimate in device performance without radical revision of the structural philosophy of the integrated element.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a monolithic integrated semiconductor structure comprising the steps of forming a plurality of regions of a high concentration of one type conductivity in a substrate region of the opposite conductivity type;

expitaxially growing a layer of said one type conductivity on said substrate layer and on said regions having a high concentration of said one type conductivity;

isolating regions of said expitaxially grown layer by diffusing a network of connecting regions of said opposite type conductivity into said epitaxially grown layer, said isolating regions being in contact with said substrate region;

forming active and passive devices in isolated regions of said epitaxially grown layer;

removing a selected portion of the final oxide layer to expose a surface portion of the monolithic semiconductor structure;

depositing a layer of gold on the monolithic semicondcutor surface in contact with the exposed surface portion thereof;

diffusing the gold into the exposed monolithic semiconductor surface by heating the structure in a non-oxidizing atmosphere for a period of time and at a temperature sufficient to dope said integrated structure with carrier lifetime killing impurities;

annealing the monolithic semiconductor structure by heat treating in a non-oxidizing atmosphere for a period of time and at a temperature sufficient to increase the transistor current gain of the active devices;

depositing a metal layer onto said monolithic surface thereby providing ohmic contacts to desired semiconductor regions;

subtractively removing portions of said metal layer to form an interconnection pattern;

applying a sputtered oxide coating to the monolithic surface;

forming terminal holes in said sputtered oxide layer;

evaporating chrome, copper and gold contact layers into each terminal hole region; and evaporating lead-tin pads onto the chrome, copper, gold contact layers.

* * * * *

PO-1050
(5/69)

UNITED STATES PATENT OFFICE
CERTIFICATE OF CORRECTION

Patent No. 3,731,375 Dated May 8, 1973

Inventor(s) Benjamin Agusta, Paul H. Bardell, Paul P. Castrucci Robert A. Henle, Raymond P. Pecorato It is certified that error appears in the above-identified patent and that said Letters Patent are hereby corrected as shown below:

Column 6, Line 24 (In the Application Page 14, Line 3) — change "$10^{20}cm^{-B3}$" to--$10^{20}cm^{-3}$--

Column 8, Line 44 (In the Application Page 18, Line 19) — change "wavers" to--wafers--

Column 27, Line 27 (In the Application Page 59, Line 8) — change "4" to--(4)-- in each instance Column 29, Line 46 (In the Application Page 64, Line 3) — change "0" to--"0"--

Column 30, Line 45 (In the Application Page 66, Line 15) — change "conductive" to--Conductive Column 31, Line 20 (In the Application Page 67, Line 22) — correct "terminsl" to--terminals--

PO-1050
(5/69)

UNITED STATES PATENT OFFICE
CERTIFICATE OF CORRECTION

Patent No. 3,731,375 Dated May 8, 1973

Inventor(s) Benjamin Agusta et al. Page - 2

It is certified that error appears in the above-identified patent and that said Letters Patent are hereby corrected as shown below:

| | |
|---|---|
| Column 31, Line 38 (In the Application Page 68, Line 11) | change "o" to--O-- |
| Column 31, Line 40 (In the Application Page 68, Line 12) | in the second instance change "the" to--The-- |
| Column 32, Claim 1, Line 28 (In the Claims, Claim 1 Line 17) | change "semicondcutor" to--semiconductor-- |

Signed and sealed this 19th day of February 1974.

(SEAL)
Attest:

EDWARD M.FLETCHER,JR.
Attesting Officer

C. MARSHALL DANN
Commissioner of Patents